United States Patent
Sim et al.

(10) Patent No.: US 8,203,135 B2
(45) Date of Patent: Jun. 19, 2012

(54) SEMICONDUCTOR DEVICE INCLUDING UNIFORM CONTACT PLUGS AND A METHOD OF MANUFACTURING THE SAME

(75) Inventors: Kyu-Rie Sim, Seoul (KR); Jung-Hoon Park, Seoul (KR); Yoon-Jong Song, Seoul (KR); Jae-Min Shin, Seoul (KR); Shin-Hee Han, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 311 days.

(21) Appl. No.: 12/697,620

(22) Filed: Feb. 1, 2010

(65) Prior Publication Data

US 2010/0200833 A1 Aug. 12, 2010

(30) Foreign Application Priority Data

Feb. 6, 2009 (KR) .................. 10-2009-0009731

(51) Int. Cl.
*H01L 29/41* (2006.01)

(52) U.S. Cl. ............ 257/4; 257/350; 257/529; 257/536; 257/537; 257/775; 257/E27.016; 257/E45.002; 365/148

(58) Field of Classification Search .................. 257/1, 2, 257/3, 4, 528, 529, 530, 536, 537, E27.016, 257/E27.047, E27.071, E45.001, E45.002; 365/148, 158, 159
See application file for complete search history.

(56) References Cited

U.S. PATENT DOCUMENTS

2006/0180803 A1  8/2006  Suh et al.

FOREIGN PATENT DOCUMENTS

| | | |
|---|---|---|
| JP | 2006-229238 | 8/2006 |
| KR | 1020060072519 | 6/2006 |
| KR | 1020060075427 | 7/2006 |
| KR | 1020060092398 | 8/2006 |

*Primary Examiner* — Evan Pert
*Assistant Examiner* — Eduardo A Rodella
(74) *Attorney, Agent, or Firm* — F. Chau & Associates, LLC

(57) ABSTRACT

A semiconductor device, a semiconductor module, an electronic apparatus and methods of fabricating and manufacturing the same are provided. The semiconductor device includes a lower interconnection formed on a substrate, a plurality of control patterns formed on the lower interconnection, a plurality of lower contact plug patterns formed on the control patterns, a plurality of storage patterns formed on the lower contact plug patterns, a plurality of upper electrodes formed on the storage patterns, and a plurality of upper interconnections formed on the upper electrodes. The lower contact plug patterns each include at least two contact holes having different sizes, a plurality of sidewall patterns formed on inner sidewalls of the two contact holes and wherein the sidewall patterns have different thicknesses from one another. The semiconductor device further includes a plurality of electrode patterns conformably formed on the inside of the sidewall patterns and having size errors less than 10%, and a plurality of filling patterns formed inside the electrode patterns and completely filling the inside of the contact holes.

10 Claims, 13 Drawing Sheets

SEMICONDUCTOR DEVICE INCLUDING UNIFORM CONTACT PLUGS AND A METHOD OF MANUFACTURING THE SAME

CROSS-REFERENCE TO RELATED APPLICATION

This application claims priority to Korean Patent Application No. 10-2009-0009731, filed on Feb. 6, 2009, the disclosure of which are hereby incorporated by reference herein in its entirety.

BACKGROUND

1. Technical Field

Exemplary embodiments of the inventive concept relate to a semiconductor device including uniform contact plugs and to a method of manufacturing the same.

2. Description of Related Art

Among techniques for providing highly integrating semiconductor devices, the field of patterning techniques is considered one of the most significant technical fields for providing highly integrated semiconductor devices. These patterning techniques typically involve forming material films having specific shapes, and can be divided into photolithography techniques and etching techniques. The photolithography techniques may involve minutely forming a photoresist pattern used as an etching mask, and the etching techniques may involve etching a material film using a photoresist pattern as an etching mask. To form more minute patterns, a variety of patterning techniques have been developed. However, the patterning techniques may not sufficiently improve pattern uniformity.

SUMMARY

Exemplary embodiments of the inventive concept may provide a semiconductor device.

Exemplary embodiments of the inventive concept may also provide a semiconductor module including the semiconductor device.

Exemplary embodiments of the inventive concept may also provide an electronic apparatus including the semiconductor device.

Exemplary embodiments of the inventive concept may also provide a method of fabricating a semiconductor device.

Exemplary embodiments of the inventive concept may also provide a method of manufacturing a semiconductor module including the semiconductor device.

Exemplary embodiments of the inventive concept may also provide a method of manufacturing an electronic apparatus including the semiconductor device.

In accordance with an exemplary embodiment of the inventive concept, a semiconductor device is provided. The semiconductor device includes a lower interconnection formed on a substrate, a plurality of control patterns formed on the lower interconnection, a plurality of lower contact plug patterns formed on the control patterns, a plurality of storage patterns formed on the lower contact plug patterns, a plurality of upper electrodes formed on the storage patterns and a plurality of upper interconnections formed on the upper electrodes. The lower contact plug patterns each include at least two contact holes having different sizes, a plurality of sidewall patterns formed on inner sidewalls of the two contact holes, wherein the sidewall patterns have different thicknesses from one another. The semiconductor device further includes a plurality of electrode patterns conformably formed inside of the sidewall patterns and having size errors less than 10%, and a plurality of filling patterns formed in inside the electrode patterns and completely filling the inside of the contact holes.

In accordance with an exemplary embodiment of the inventive concept, a semiconductor device is provided. The semiconductor device includes a lower interconnection formed on a substrate, a capping layer disposed on the lower interconnection, a first interlayer insulating layer formed on the capping layer, a plurality of control patterns each composed of diodes formed in the first interlayer insulating layer and on the lower interconnection, and wherein the control patterns each include a first conductivity type ion doping pattern, a second conductivity type ion doping pattern and a barrier pattern. The semiconductor device further includes a plurality of lower contact plug patterns formed in the first interlayer insulating layer and on the control patterns, a second interlayer insulating layer formed on the first interlayer insulating layer, a plurality of storage patterns made of resistance changeable materials formed in the second interlayer insulating layer and on the lower contact plug patterns, a plurality of upper electrodes formed in the second interlayer insulating layer and on the storage patterns, a plurality of upper contact plugs formed in the second interlayer insulating layer and on the upper electrodes, a third interlayer insulating layer formed on the second interlayer insulating layer and a plurality of upper interconnections formed in the third interlayer insulating layer and on the upper contact plugs, wherein the upper electrodes are electrically connected to the upper interconnections via the upper contact plugs. The lower contact plug patterns each include a first contact hole having a first diameter, a second contact hole having a second diameter being smaller than the first diameter, and a third contact hole having a third diameter being smaller than the second diameter, wherein difference ratio of the first and third diameters is less than 10%, a first spacer formed on an inner sidewall of the first contact hole, a second spacer formed on an inner sidewall of the second contact hole, and a third spacer formed on an inner sidewall of the third contact hole, wherein the first spacer has a first thickness, the second spacer has a second thickness thinner than the first thickness, and the third spacer has a third thickness thinner than the second thickness, wherein the difference ratio of the first and third thicknesses is less than 10%, a first electrode pattern conformably formed on an inner sidewall of the first spacer, a second electrode pattern conformably formed on an inner sidewall of the second spacer, and a third electrode pattern conformably formed on an inner sidewall of the third spacer, wherein the difference ratio of the first and third electrode patterns is less than 10%. The semiconductor device further includes a plurality of filling patterns formed inside the electrode patterns and completely filling the inside of the contact holes.

In accordance with another exemplary embodiment of the inventive concept, a semiconductor module is provided. The semiconductor module includes a module substrate, at least one semiconductor device disposed on the module substrate and a contact terminal disposed at an edge of the module substrate. The least one semiconductor device includes a lower interconnection formed on a substrate, a plurality of control patterns formed on the lower interconnection, a plurality of lower contact plug patterns formed on the control patterns, a plurality of storage patterns formed on the lower contact plug patterns, a plurality of upper electrodes formed on the storage patterns and a plurality of upper interconnections formed on the upper electrodes. The lower contact plug patterns each include at least two contact holes having different sizes, a plurality of sidewall patterns formed on inner sidewalls of the two contact holes and wherein the sidewall patterns have different thicknesses from each other. The semiconductor device further includes a plurality of electrode patterns conformably formed inside of the sidewall patterns and having size errors less than 10%, and a plurality of filling patterns formed inside the electrode patterns and completely filling the inside of the contact holes.

In accordance with another exemplary embodiment of the inventive concept, an electronic apparatus is provided. The electronic apparatus includes a housing, a memory unit in the housing, an input/output unit and a controller to control the memory unit and the input/output unit. The memory unit includes at least one semiconductor device which includes a lower interconnection formed on a substrate, a plurality of control patterns formed on the lower interconnection, a plurality of lower contact plug patterns formed on the control patterns, a plurality of storage patterns formed on the lower contact plug patterns, a plurality of upper electrodes formed on the storage patterns and a plurality of upper interconnections foamed on the upper electrodes. The lower contact plug patterns include at least two contact holes having different sizes, a plurality of sidewall patterns formed on inner sidewalls of the two contact holes and wherein the sidewall patterns have different thicknesses from one another. The semiconductor device further includes a plurality of electrode patterns conformably formed inside of the sidewall patterns and having size errors less than 10%, and a plurality of filling patterns formed in inside the electrode patterns and completely filling the inside of the contact holes.

In accordance with another exemplary embodiment of the inventive concept, a method of manufacturing a semiconductor device is provided. The method includes forming a lower interconnections on a substrate, forming a first interlayer insulating layer on the lower interconnection, forming a plurality of control pattern holes which vertically pass through the first interlayer insulating layer and partially expose the lower interconnections, forming a plurality of control patterns filling the control pattern holes, forming a plurality of lower contact plug patterns on the control patterns, forming a plurality of storage patterns on the contact plug patterns, forming a plurality of upper electrodes on the storage patterns, forming a plurality of upper contact plugs on the upper electrodes and forming a plurality of upper interconnections on the upper contact plugs. The forming of the lower contact plug patterns includes, forming at least two lower contact holes having different diameters, forming a plurality of sidewall patterns on inner sidewalls of the two contact holes and wherein the sidewall patterns have different thicknesses from one another. The method further includes forming a plurality of electrode patterns conformably inside the sidewall patterns and having difference ratio of the thicknesses less than 10%, and forming a plurality of filling patterns inside the electrode patterns and completely filling the inside of the contact holes.

In accordance with another exemplary embodiment of the inventive concept, a method of fabricating a semiconductor device is provided. The method includes forming a lower interconnection formed on a substrate, forming a capping layer on the lower interconnection, forming a first interlayer insulating layer on the capping layer, forming a plurality of control patterns including a plurality diodes in the first interlayer insulating layer and on the lower interconnection, wherein the control patterns each include a first conductivity type ion doping pattern, a second conductivity type ion doping pattern and a barrier pattern, The method further includes forming a plurality of lower contact plug patterns in the first interlayer insulating layer and on the control patterns, forming a second interlayer insulating layer on the first interlayer insulating layer; forming a plurality of storage patterns made of resistance changeable materials in the second interlayer insulating layer and on the lower contact plug patterns, forming a plurality of upper electrodes in the second interlayer insulating layer and on the storage patterns, forming a plurality of upper contact plugs in the second interlayer insulating layer and on the upper electrodes, forming a third interlayer insulating layer on the second interlayer insulating layer and forming a plurality of upper interconnections in the third interlayer insulating layer and on the upper contact plugs, wherein the upper electrodes are electrically connected to the upper interconnections via the upper contact plugs. The forming of the lower contact plug patterns includes: forming a first contact hole having a first diameter, forming a second contact hole having a second diameter being smaller than the first diameter, and forming a third contact hole having a third diameter being smaller than the second diameter, wherein difference ratio of the first and third diameters is less than 10%, forming a first spacer on an inner sidewall of the first contact hole, forming a second spacer on an inner sidewall of the second contact hole, and forming a third spacer on an inner sidewall of the third contact hole, wherein the first spacer has a first thickness, the second spacer has a second thickness thinner than the first thickness, and the third spacer has a third thickness thinner than the second thickness, wherein a first difference ratio of the first and third thicknesses is less than 10%, forming a first electrode pattern conformably on an inner sidewall of the second spacer, forming a second electrode pattern conformably on an inner sidewall of the second spacer, and forming a third electrode pattern conformably on an inner sidewall of the third spacer, wherein a second difference ratio of the first and third electrode patterns is less than 10%, wherein the first difference ratio is larger than the second difference ratio. The method further includes forming a plurality of filling patterns inside the electrode patterns and completely filling the inside of the contact holes.

In accordance with another exemplary embodiment of the inventive concept, a method of manufacturing a semiconductor module is provided. The method includes providing a module substrate, disposing at least one semiconductor device on the module substrate and disposing a contact terminal at an edge of the module substrate. The at least one semiconductor device is fabricated by a process comprising, forming a lower interconnection on a substrate, forming a first interlayer insulating layer on the lower interconnection; forming a plurality of control pattern holes which vertically pass through the first interlayer insulating layer and partially expose the lower interconnection, forming a plurality of control patterns filling the control pattern holes, forming a plurality of lower contact plug patterns on the control patterns, forming a plurality of storage patterns on the contact plug patterns, forming a plurality of upper electrodes on the storage patterns, forming a plurality of upper contact plugs on the upper electrodes and forming a plurality of upper interconnections on the upper contact plugs. The forming of the lower contact plug patterns includes: forming at least two lower contact holes having different diameters, forming a plurality of sidewall patterns on inner sidewalls of the two contact holes and wherein the sidewall patterns have different thicknesses from one another. The process further includes forming a plurality of electrode patterns conformably inside of the sidewall patterns and having difference ratio of the thicknesses less than 10%, and forming a plurality of filling patterns inside the electrode patterns and completely filling the inside of the contact holes.

In accordance with still another exemplary embodiment of the inventive concept, a a method of manufacturing an electronic apparatus is provided. The method includes providing a housing, installing a memory unit having at least one semiconductor device in the housing, installing an input/output unit and installing a controller to control the memory unit and the input/output unit. The at least one the semiconductor device is fabricated by a process which includes forming a lower interconnection on a substrate, forming a first interlayer insulating layer on the lower interconnection, forming a plurality of control pattern holes which vertically pass through the first interlayer insulating layer and partially expose the lower interconnection, forming a plurality of control patterns filling the control pattern holes, forming a plurality of lower contact plug patterns on the control patterns, forming a plurality of storage patterns on the contact plug patterns, forming a plurality of upper electrodes on the storage patterns, forming a plurality of upper contact plugs on the upper electrodes and forming a plurality of upper interconnections on the upper contact plugs. The forming of the lower contact plug patterns includes: forming at least two lower contact holes having different diameters, forming a plurality of sidewall patterns on inner sidewalls of the two contact holes and wherein the sidewall patterns have different thicknesses from one another. The process further includes forming a plurality of electrode patterns conformably inside the sidewall patterns and having difference ratio of the thicknesses less than 10%, and forming a plurality of filling patterns inside the electrode patterns and completely filling the inside of the contact holes.

BRIEF DESCRIPTION OF THE DRAWINGS

Exemplary embodiments of the inventive concept are described in further detail below with reference to the accompanying drawings. It should be understood that various aspects of the drawings may have been exaggerated for clarity.

DETAILED DESCRIPTION OF THE EXEMPLARY EMBODIMENTS

Figure 1A:
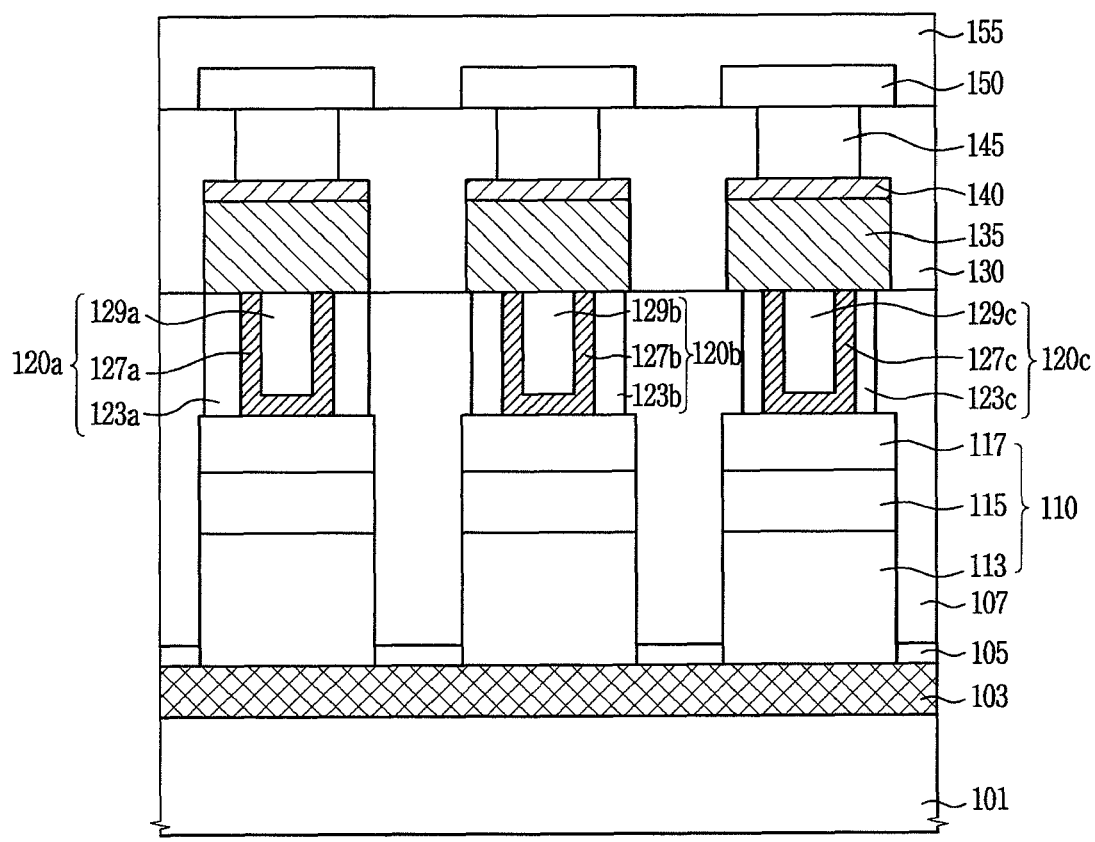
FIG. 1A is a vertical cross-sectional view of a semiconductor device according to an exemplary embodiment of the inventive concept.

Various exemplary embodiments of the inventive concept will now be described more fully with reference to the accompanying drawings in which some exemplary embodiments of the inventive concept are shown. This inventive concept may, however, be embodied in different forms and should not be construed as limited to the embodiments set forth herein. The sizes of a layer and regions may be exaggerated for clarity. Like reference numerals designate like elements throughout the specification.

Various exemplary embodiments of the inventive concept described in this specification will be described with reference to ideal plan and cross-sectional views of this specification. Therefore, the shapes of the illustrated drawings may be modified depending on manufacturing techniques and/or permissible errors. Therefore, exemplary embodiments of the inventive concept are not limited to specific shapes illustrated in the drawings, but include changes in shape occurring depending on manufacturing processes. Accordingly, regions illustrated in the drawings have schematic properties, and the shapes of regions shown in the drawings illustrate specific shapes of regions of a device, but do not limit the scope of the inventive concept.

Terms used in this specification are not used with peculiar meanings of their own, but are selected for relative discrimination among components according to exemplary embodiments of the inventive concept. Therefore, the names, shapes, or functions of the respective components should be understood slightly differently from existing concepts. For example, a term "contact" is a component having a function of transmitting an electrical signal in a vertical direction. Further, it can be understood that a term "hole" means a pattern of which the inside is empty, and a term "plug" means a cylindrical pattern formed inside. Further, a term "interconnections" means a component having a function of transmitting an electrical signal in a horizontal direction. The contact and the interconnections have different meanings from each other, and the meanings thereof are not used together in this specification.

Figure 1B:
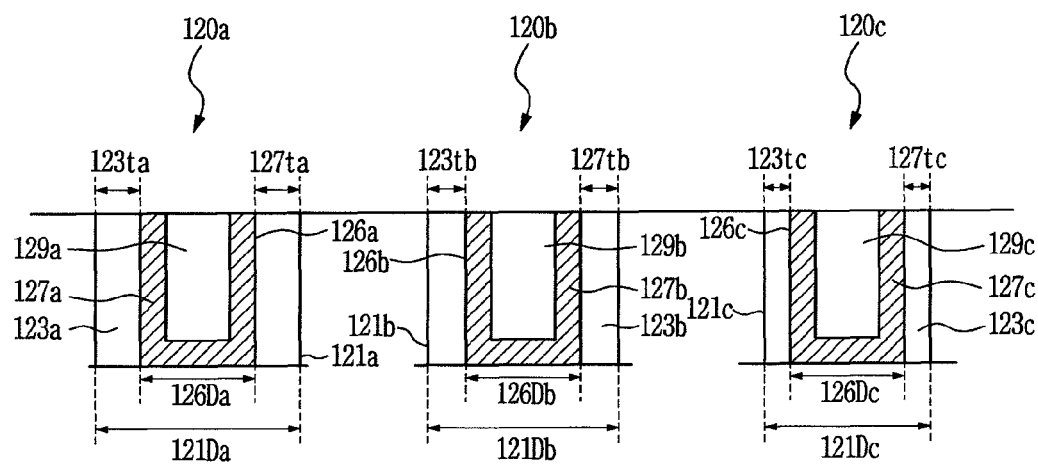
FIG. 1B is an expanded cross-sectional view of lower contact plugs of the semiconductor device according to an exemplary embodiment of the inventive concept.
Figure 1C:
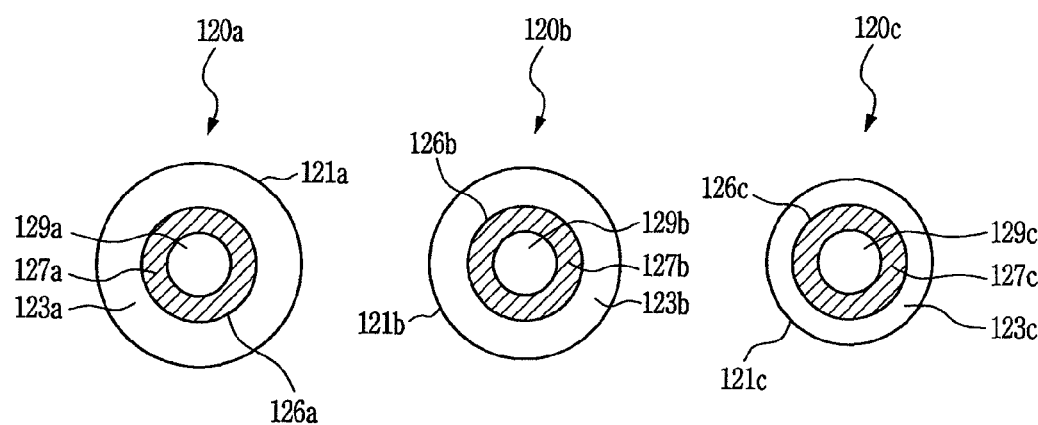
FIG. 1C is a plan view or cross-sectional view of the lower contact plugs according to an exemplary embodiment of the inventive concept.

FIG. 1A is a vertical cross-sectional view of a semiconductor device according to an exemplary embodiment of the inventive concept, FIG. 1B is an expanded vertical cross-sectional view of lower contact plugs of the semiconductor device according to an exemplary embodiment of the inventive concept, and FIG. 1C is a plan view or horizontal cross-sectional view of the lower contact plugs according to an exemplary embodiment of the inventive concept.

Referring to FIGS. 1A and 1B, the semiconductor device 100 according to an exemplary embodiment of the inventive concept includes a lower interconnection 103 formed on a substrate 101, control patterns 110 formed on the lower interconnection 103, lower contact plug patterns 120a to 120c formed on the control patterns 110, storage patterns 135 formed on the lower contact plug patterns 120a to 120c, upper electrodes 140 formed on the storage patterns 135, and upper interconnections 150 formed on the upper electrodes 140. A first interlayer insulating layer 107 may be formed on the lower interconnection 103. A capping layer 105 may be formed between the lower interconnection 103 and the first interlayer insulating layer 107. A second interlayer insulating layer 130 may be formed on the first interlayer insulating layer 107. A third interlayer insulating layer 155 may be formed on the second interlayer insulating layer 130. The upper electrodes 140 and the upper interconnections 150 may be electrically connected through upper contact plug patterns 145.

The substrate 101 may be, for example, a single-crystal silicon wafer, an n-type or p-type-doped silicon wafer, or a silicon-on-insulator (SOI) wafer.

The lower interconnection 103 may be one of conductors formed in the shape of parallel lines. The lower interconnection 103 may be formed in an upper portion of the substrate 101 or on a top surface of the substrate 101. For example, when the lower interconnection 103 are formed in an upper portion of the substrate 101, the lower interconnection 103 may be interpreted as a silicon layer of an SOI wafer or an ion implanted region of the substrate 101 to form the lower interconnections 103 to have low resistance and high conductivity. When the lower interconnection 103 are formed on the substrate 101, a conductive material pattern may be formed, for example, in a gate line shape or any line shape. For example, the lower interconnection 103 may be formed of doped poly silicon, metal silicides, metals, or metal compounds.

The capping layer 105 may be interpreted as conductive layers or insulating layers. For example, when the capping layer 105 is a barrier layer formed on the lower interconnection 103, the capping layer 105 may include a metal compound layer, but may be interpreted as an insulating layer such as, for example, silicon nitride. Further, the capping layer 105 may be interpreted as an etch stop layer for protecting the lower interconnection 103 from an outside attack such as, for example, an etching process or the like. In this exemplary embodiment of the inventive concept, if all conductive layers or insulating layers having a variety of functions were illustrated and described, most of the drawings would become similar, and the descriptions thereof would be complicated. Therefore, the various layers are not illustrated one by one. Therefore, the capping layer 105 may be formed, for example, in the shape of parallel lines or a wide plate.

The control patterns 110 may be formed between the lower contact plug patterns 120a to 120c and the lower interconnection 103 to control a current flow. That is, the control patterns 110 can control an on/off function for the current flow. The control patterns 110 may be composed of diodes or transistors. In this exemplary embodiment of the inventive concept, the control patterns 110 may be composed of diodes. When the control patterns 110 are composed of transistors, bipolar transistors may be used. The control patterns 110 may include n-type ion doping patterns 113 and p-type ion doping patterns 115. The n-type ion doping patterns 113 may be formed adjacent to the lower interconnection 103, and the p-type ion doping patterns 115 may be formed adjacent to the lower contact plug patterns 120a to 120c. Barrier patterns 117 may be formed between the p-type ion doping patterns 115 and the lower contact plug patterns 120a to 120c.

The lower contact plug patterns 120a to 120c may include sidewall patterns 123a to 123c, electrode patterns 127a to 127c, and filling patterns 129a to 129c, which are formed in lower contact holes 121a to 121c, respectively. The sidewall patterns 123a to 123c may be formed on portions of bottom surfaces and inner sidewalls of the lower contact holes 121a to 121c. The electrode patterns 127a to 127c may be conformably formed on portions of the bottom surfaces of the lower contact holes 121a to 121c and the sidewall patterns 123a to 123c. The filling patterns 129a to 129c may be formed on the electrode patterns 120a to 120c to fill electrode holes 126a to 126c. That is, the filling patterns 129a to 129c may be formed in, for example, a plug shape.

The lower contact holes 121a to 121c may be formed to have at least two different hole sizes. In this exemplary embodiment of the inventive concept, the lower contact holes 121a to 121c having three kinds of hole sizes 121Da to 121Dc are taken as examples. For example, the first lower contact hole 121a has the largest hole size, the second lower contact hole 121b has an intermediate hole size, and the third lower contact hole 121c has the smallest hole size. The hole size refers to the horizontal magnitude of the hole, e.g., the width or diameter of the hole. In some cases, the hole size may mean the depth of the hole. In this exemplary embodiment of the inventive concept, three lower contact holes 121a to 121c are taken as examples such that the technical idea of the inventive concept can be readily understood. However, exemplary embodiments of the inventive concept are not limited thereto. The difference ratio of the hole sizes is less than 10% from each other.

The sidewall patterns 123a to 123c may be formed to have at least two different horizontal thicknesses. In this exemplary embodiment of the inventive concept, three sidewall patterns 123a to 123c having three kinds of horizontal thicknesses 123ta to 123tc are taken as examples. For example, the first sidewall pattern 123a has the largest horizontal thickness, the second sidewall pattern 123b has an intermediate horizontal thickness, and the third sidewall pattern 123c has the smallest horizontal thickness. In this exemplary embodiment of the inventive concept, three kinds of horizontal thicknesses 123ta to 123tc are taken as examples such that the technical idea of the inventive concept can be readily understood. The first sidewall pattern 123a may be formed in the first lower contact hole 121a, the second sidewall pattern 123b may be formed in the second lower contact hole 121b, and the third sidewall pattern 123c may be formed in the third lower contact hole 121c. The sidewall patterns 123a to 123c may be formed of an insulating material. For example, the sidewall patterns 123a to 123c may be formed of a silicon nitride layer. By changing process conditions at which the sidewall patterns 123a to 123c are formed, a variety of sidewall patterns 123a to 123c having different horizontal thicknesses 123ta to 123tc may be formed, as illustrated in this specification. The drawings illustrate that the sidewall patterns 123a to 123c have vertical sidewalls, but the sidewall patterns 123a to 123c may have sidewalls formed, for example, in a spacer shape of which the upper portion is narrow and the lower portion is wide. The difference ratio of the thicknesses of the sidewall patterns 123a to 123c is less than 10% from each other.

The electrode patterns 127a to 127c may be foamed to have a similar thickness, regardless of the sizes 121Da to 121Dc of the respective lower contact holes. That is, the electrode patterns 127a to 127c may have an identical or similar thickness and shape as a whole, regardless of differences between the sizes 121Da to 121Dc of the first to third lower contact holes or the horizontal thicknesses 123ta to 123tc of the first to third sidewall patterns. As the electrode patterns 127a to 127c serve to supply a current to the storage patterns 135, an identical current should be applied as a whole. Therefore, the electrode patterns 127a to 127c may be formed to have an identical or similar thickness and shape as a whole, regardless of the sizes 121Da to 121Dc of the lower contact holes or the horizontal thicknesses 123ta to 123tc of the sidewall patterns. For example, the electrode patterns 127a to 127c may be formed such that errors in size therebetween are less than 10%. For example, the electrode patterns 127a to 127c may be formed such that the size errors are less than 5%. The electrode patterns 127a to 127c may be applied as diffusion barrier layers in another application exemplary embodiment of the inventive concept. The electrode patterns 127a to 127c may function as a diffusion barrier layer as well as an electrode. When the size errors of the electrode patterns 127a to 127c exceed a permissible value, data which can obtained from the storage patterns 135 may become incorrect, or changes in time required for reading or writing data may become irregular. Thus, as a result, it may be difficult to correctly control an operation. In an existing capacitor-type or charge trap-type memory device, a matter of concern is to set the resistance of electrodes to a proper value (e.g., not too high), e.g., to maintain the minimum amount of current at a sufficient level, and wherein low resistance is not generally a difficulty. In a resistance memory device, however, electrodes should transmit an identical current as a whole to stabilize the operation of a semiconductor device. Therefore, controlling the sizes of the electrode patterns 127a to 127c is considered to be more significant than ever.

The filling patterns 129a to 129c may be formed to fill the electrode holes 126a to 126c. The filling patterns 129a to 129c may be formed of a conductor or insulator. When the filling patterns 129a to 129c are formed of a conductor, the filling patterns 129a to 129c can be understood as plug-type patterns. In this case, the electrode patterns 127a to 127c may be understood as diffusion barrier layers. When the filling patterns 129a to 129c are formed of an insulator, the electrode patterns 127a to 127c may function as an electrode. For example, when too much current flows through resistance semiconductor devices, it may have a negative effect on the operation stability of the devices. In this case, conductors such as the electrode patterns 127a to 127c should have proper conductivity or resistance.

The storage patterns 135 are patterns capable of storing data. For example, the storage patterns 135 may be patterns capable of storing charges like capacitors, charge trapping material patterns, or resistance changeable material patterns. When the storage patterns 135 are resistance changeable material patterns, the storage patterns 135 may be composed of magnet changeable material patterns or phase changeable material patterns. As examples for specific materials depending on the types of the respective patterns are well known, the materials are not enumerated in this specification. In this specification, it is assumed that the storage patterns 135 are phase changeable material patterns, as an exemplary embodiment of the inventive concept in which they can be readily illustrated.

The upper electrodes 140 may be formed on the storage patterns 135 such that the upper surfaces of the storage patterns 135 are not exposed. The upper electrodes 140 may include metals. For example, the upper electrodes 140 may include one or more of a single-layer or multilayer metal, a metal alloy, and a metal compound. Further, the upper electrodes 140 may include barrier layers. In the drawings, the barrier layers are omitted to prevent the drawings from being complicated.

The upper interconnections 150 may be interconnections for transmitting data or supplying supply voltages. The supply voltages include a device voltage, a ground voltage, and/or a cell voltage. The drawing illustrates that the upper interconnections 150 have a line shape formed in a front and rear direction. However, the upper interconnections 150 may have, for example, a line shape formed in a side to side direction (left to right direction).

The upper contact plugs 145 may be patterns for electrically connecting the upper electrodes 140 to the upper interconnections 150. Therefore, the upper contact plugs 145 may be formed of a conductor.

The interlayer insulating layers 107, 130, and 155 may be composed of, for example, pluralities of layers formed multiple times. In this exemplary embodiment of the inventive concept, the first to third interlayer insulating layers 107, 130, and 155 are designated for convenience, but a larger number of layers may be stacked. For example, the interlayer insulating layers 107, 130, and 155 may be formed of silicon oxide, and may be formed of the same material or similar materials. In this case, interfaces between the interlayer insulating layers 107, 130, and 155 may not be shown. Therefore, the interfaces between the interlayer insulating layers 107, 130, and 155 illustrated in the drawing may not be discriminated in an actual semiconductor device. Further, different capping layers or stopper layers may be formed at the interfaces between the interlayer insulating layers 107, 130, and 155. For example, capping layers or stopper layers may be formed at more positions in addition to the interfaces between the interlayer insulating layers 107, 130, and 150. In these cases, however, as the drawing may become complicated, they are not illustrated, but it should be understood that the technical idea of the inventive concept includes all these cases.

FIG. 1C exaggeratingly illustrates the shapes of the lower contact plugs 120a to 120c such that the technical idea of the inventive concept can be readily understood. The first lower contact hole 121a has the largest size, the second lower contact hole 121b has an intermediate size, and the third lower contact hole 121c has the smallest size. The first sidewall pattern 123a has the largest width, the second sidewall pattern 123b has an intermediate width, and the third sidewall pattern 123c has the smallest width. However, the sizes of the electrode patterns 127a to 127c are almost the same as one another, and the sizes of the filling patterns 129a to 129c are also almost the same as one another. The lower contact holes 120a to 120c are formed to have different sizes from one another. However, as the sizes of the lower contact holes 121a to 121c are compensated for by the thicknesses of the sidewall patterns 123a to 123c, the electrode holes 126a to 126c have an identical size or size differences within a process permissible range, for example, differences less than 10%. A relatively thick sidewall pattern is formed in a lower contact hole having a relatively large size, and a relatively thin sidewall pattern is formed in a lower contact hole having a relatively small size. Thus, as the size differences between the lower contact holes 121a to 121c are compensated for, the electrode patterns 127a to 127c having a relatively uniform size may be formed. The difference ratio of the hole sizes is less than 10% from each other.

Figure 2A:
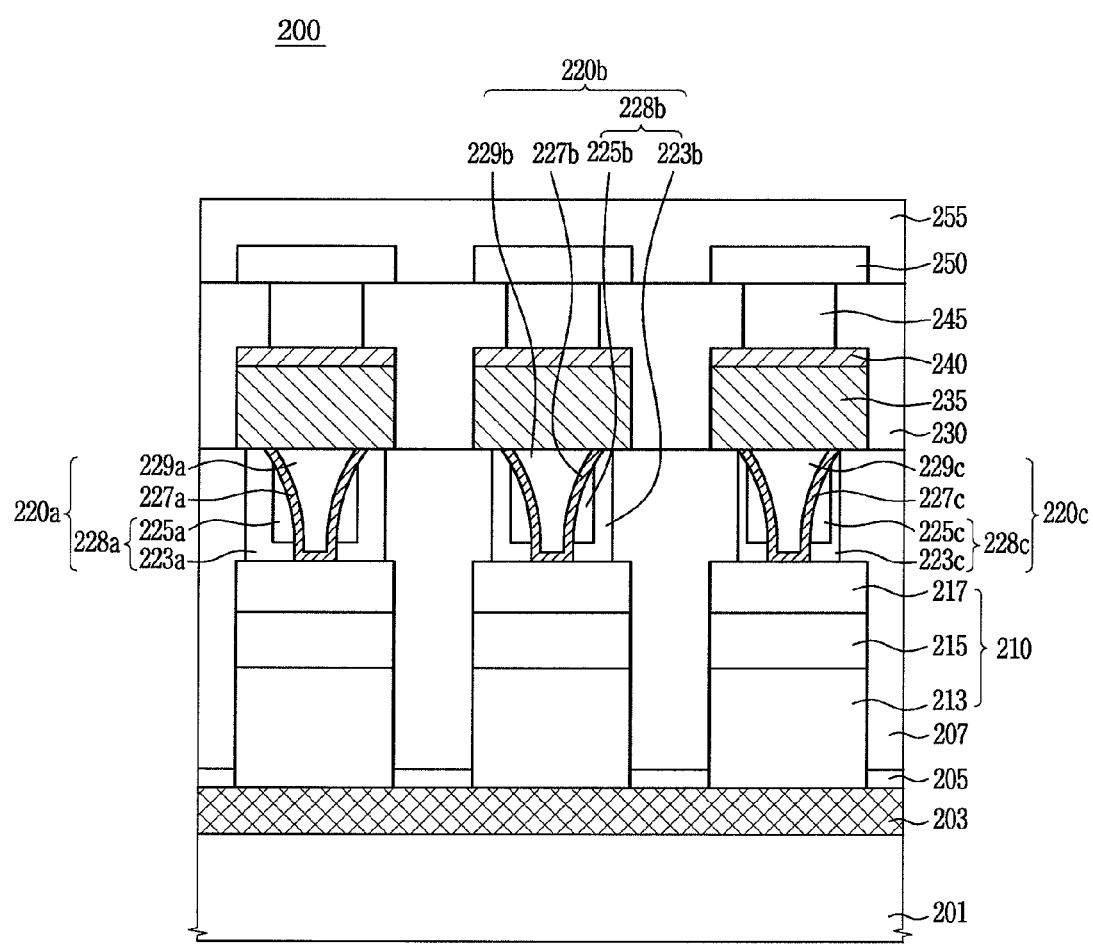
FIG. 2A is a vertical cross-sectional view of a semiconductor device according to an exemplary embodiment of the inventive concept.
Figure 2B:
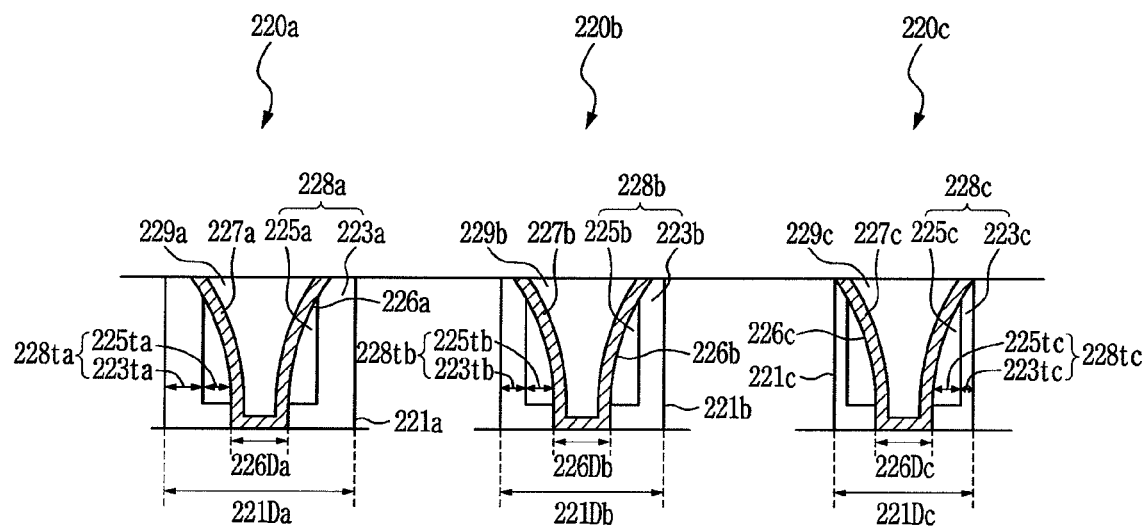
FIG. 2B is an expanded cross-sectional view of lower contact plugs of the semiconductor device according to an exemplary embodiment of the inventive concept.
Figure 2C:
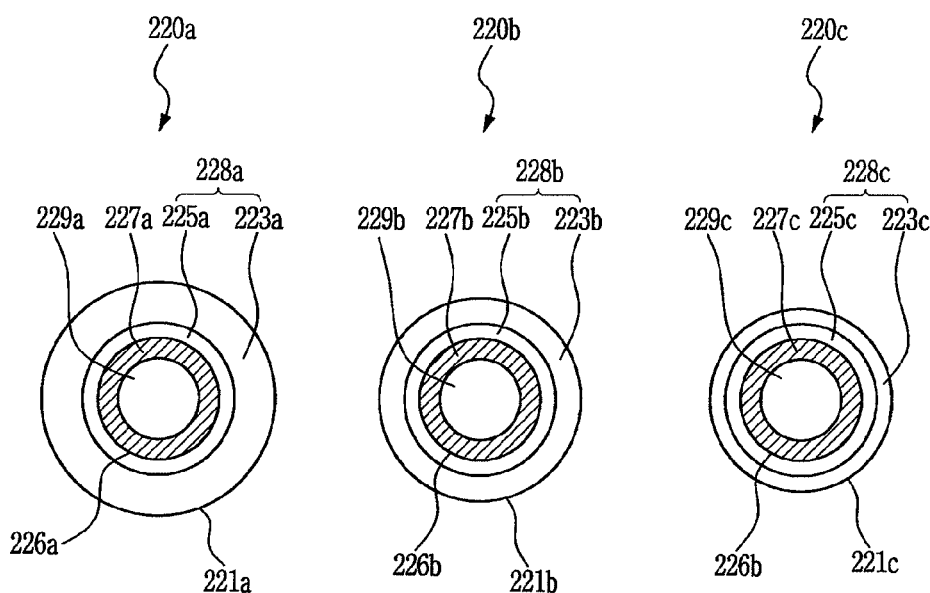
FIG. 2C is a plan or cross-sectional view of the lower contact plugs of the semiconductor device according to an exemplary embodiment of the inventive concept.

FIG. 2A is a vertical cross-sectional view of a semiconductor device according to another exemplary embodiment of the inventive concept, FIG. 2B is an expanded cross-sectional view of lower contact plugs of the semiconductor device according to another exemplary embodiment of the inventive concept, and FIG. 2C is a plan or cross-sectional view of the lower contact plugs of the semiconductor device according to another exemplary embodiment of the inventive concept.

Referring to FIGS. 2A and 2B, the semiconductor device according to another exemplary embodiment of the inventive concept includes lower interconnection 203 formed on a substrate 201, control patterns 210 formed on the lower interconnection 203, lower contact plug patterns 220a to 220c formed on the control patterns 210 and including lower electrodes, respectively, storage patterns 230 formed on the lower contact plug patterns 220a to 220c, upper electrodes 235 formed on the storage patterns 230, and upper interconnections 250 formed on the upper electrodes 235. A first interlayer insulating layer 207 may be formed on the lower interconnection 203. A capping layer 205 may be formed between the lower interconnection 203 and the first interlayer insulating layer 207. A second interlayer insulating layer 230 may be formed on the first interlayer insulating layer 207. A third interlayer insulating layer 255 may be formed on the second interlayer insulating layer 230. The upper electrodes 235 and the upper interconnections 250 may be electrically connected through the upper contact plug patterns 245.

In FIG. 2A, the lower contact plug patterns 220a to 220c include sidewall patterns 228a to 228c having, for example, multilayer spacer patterns. In this exemplary embodiment of the inventive concept, it is described that the sidewall pattern 228a includes, for example, two layers of spacer patterns 223a and 225a, the side wall pattern 229b includes two layers of spacer patterns 223b and 225b, and the side wall patterns 228c includes two layers of spacer patterns 223c and 225c. Cases in which a larger number of multilayer spacers are included will be described with reference to other drawings attached to this specification. For convenience of description, the two-layer spacer patterns 223a, 225b, 223b, 225b, 223c, and 225c are divided into outer spacer patterns 223a to 223c and inner spacer patterns 225a to 225c. First, the outer spacer patterns 223a to 223c are formed inside sidewalls of the respective lower contact holes 221a to 221c. In this case, an outer spacer pattern formed in a lower contact hole having a relatively large hole size is formed to have a large thickness, and an outer spacer pattern formed in a lower contact hole having a relatively small size is formed to have a small thickness. The size relativity of the inner spacer patterns 225a to 225c is smaller than that of the outer spacer patterns 223a to 223c. In other words, the dependence of the inner spacer patterns 225a to 225c on the sizes of the lower contact holes 221a to 221c is lower than that of the outer spacer patterns 223a to 223c. To make this more readily understood, the drawings illustrate that the inner spacer patterns 225a to 225c have identical or similar horizontal thicknesses 225ta to 225tc. Although a process of forming the outer spacer patterns 223a to 223c may be slightly unstable or have an error, the process may be adjusted so that the sidewall patterns have final horizontal thicknesses 228ta to 228tc in a process of forming the inner spacer patterns 225a to 225c. This means that processes in which differences of thickness between the outer spacer patterns 223a to 223c and the inner spacer patterns 225a to 225c are gradually reduced, can be applied. For example, differences in formation speed of the outer spacer patterns 223a, to 223c, and the inner spacer patterns 225a to 225c depending on the differences among the hole sizes 221Da to 221Dc are gradually reduced. The difference ratio of the thicknesses 223ta to 223tc of the outer spacer patterns may be set to the largest value, and the difference ratio of the thicknesses 225ta to 225tc of the inner spacer patterns may be set to the smallest value. The differences ratio of the thicknesses are less than 10% from each other, respectively. If a larger number of multilayer spacer patterns are included, the thickness difference ratio of the outermost spacer patterns may be set to the largest value, and the thickness difference ratio of the innermost spacer patterns may be set to the smallest value. The drawings illustrate that the spacer patterns 223a, 225a, 223b, 225b, 223c, and 225c have a shape of which the upper portion is narrower and the lower portion is wider. However, the spacer patterns 223a, 225a, 223b, 225b, 223c, and 225c may have a vertical sidewall shape.

FIG. 2C is a plan or cross-sectional view of the lower contact plugs 220a to 220c of the semiconductor device according to another exemplary embodiment of the inventive concept. This drawing exaggeratingly illustrates the shapes such that the technical idea of the inventive concept can be easily understood. Referring to FIGS. 2B and 2C, the first lower contact hole has the largest size 221Da, the second lower contact hole has an intermediate size 221Db, and the third lower contact hole has the smallest size 221Dc. The first sidewall pattern has the largest width 228ta, the second sidewall pattern has an intermediate width 228tb, and the third sidewall pattern has the smallest width 228tc. The first outer spacer pattern included in the first sidewall pattern 228a has the largest width 223ta, the second outer spacer pattern included in the second sidewall pattern 228b has an intermediate width 223tb, and the third outer spacer pattern included in the third sidewall pattern 228c has the smallest width 223tc. The inner spacer patterns may be formed in such a manner that differences between the widths 225ta to 225tc of the inner spacer patterns are more uniform than differences between the widths 223ta to 223tc of the outer spacer patterns. In other words, the differences between the widths 225ta to 225tc of the first to third inner spacer patterns are smaller than the differences between the widths 223ta to 223tc of the first to third outer spacer patterns. The ratios of the differences are less than 10% from each other.

Figure 3A:
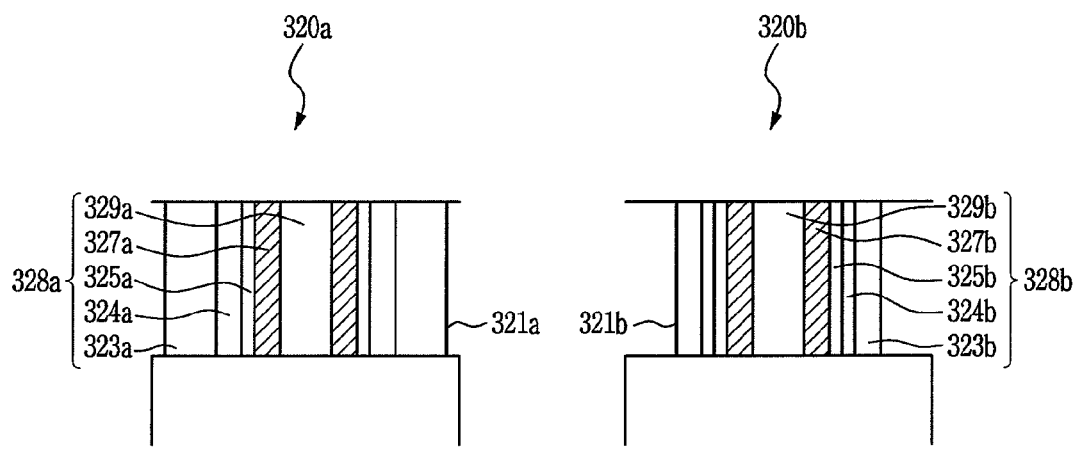
FIGS. 3A and 3B are vertical cross-sectional views of lower contact plugs according to an exemplary embodiment of the inventive concept.
Figure 3B:
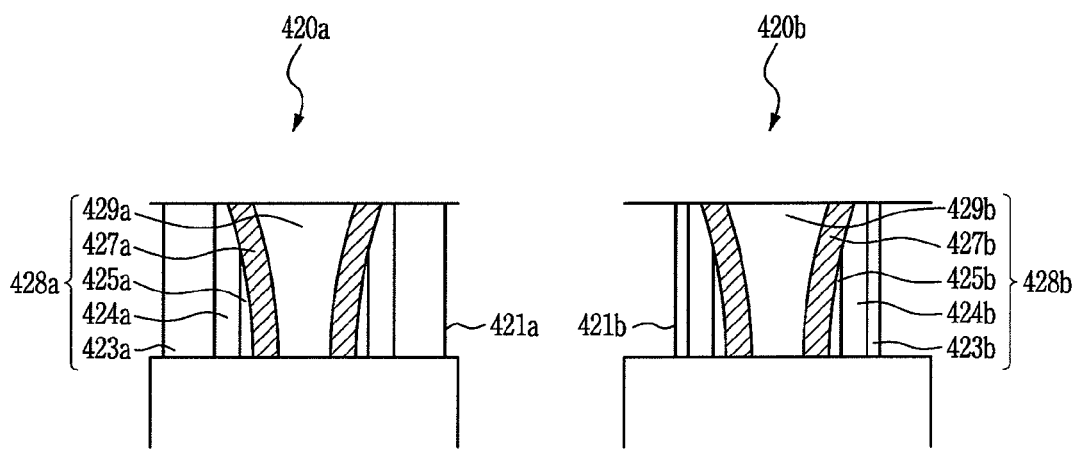

FIGS. 3A and 3B are vertical cross-sectional views of lower contact plugs according to various application exemplary embodiments of the inventive concept. Referring to FIG. 3A, left side and right side lower contact plugs 320a and 320b according to various exemplary embodiments of the inventive concept include sidewall patterns 328a and 328b having triple spacer patterns 323a to 325a and 323b to 325b, electrode patterns 327a and 327b, and filling patterns 329a and 329b, respectively. The respective spacer patterns 323a to 325a and 323b to 325b may include vertical sidewalls. The lower contact plugs 320a and 320b have lower contact holes 321a and 321b having different hole sizes from each other. The left side lower contact hole 321a may be larger than the right side lower contact hole 321b. The outer spacer pattern 323a formed inside the left side lower contact hole 321a may have a larger thickness than the outer spacer pattern 323b formed inside the right side lower contact hole 321b. Further, the intermediate spacer pattern 324a formed inside the left side lower contact hole 321a may have a larger thickness than the intermediate spacer pattern 324b formed inside the right side lower contact hole 321b. However, a thickness difference between the intermediate spacer patterns 324a and 324b is smaller than a thickness difference between the outer spacer patterns 323a and 323b. Further, a thickness difference between the inner spacer patterns 325a and 325b is the smallest among them. This is because process conditions for forming the spacer patterns 323a to 325a and 323b to 325b are different from each other. The electrode patterns 327a and 327b and the filling patterns 329a and 329b, respectively, may be formed to have substantially almost the same size or similar sizes between which a difference is less than 10%.

Referring to FIG. 3B, left side and right side lower contact plugs 420a and 420b according to another application exemplary embodiment of the inventive concept include sidewall patterns 428a and 428b having triple spacer patterns 423a to 425a and 423b to 425b, electrode patterns 427a and 427b, and filling patterns 429a and 429b, respectively. The respective spacer patterns 423a to 425a and 423b to 425b may be formed, for example, in a vertical sidewall shape or in a shape of which the upper portion is narrower and the lower portion is wider. That is, the spacer patterns 423a to 425a and 423b to 425b may have a typical spacer shape. The lower contact plugs 420a and 420b have lower contact holes 421a and 421b having different hole sizes from each other. The left side lower contact hole 421a may be larger than the right side lower contact hole 421b. The outer spacer pattern 423a formed inside the lower contact hole 421a may have a larger thickness than the outer spacer pattern 423b formed inside the lower contact hole 421b. Further, the intermediate spacer pattern 424a formed inside the lower contact hole 421a may have a larger thickness than the intermediate spacer pattern 424b formed inside the lower contact hole 421b. However, a thickness difference between the intermediate spacer patterns 424a and 424b is smaller than a thickness difference between the outer spacer patterns 423a and 423b. Further, a thickness difference between the inner spacer patterns 425a and 425b is the smallest among them. This is because process conditions for forming the spacer patterns 423a to 425a and 423b to 425b are different from each other. The electrode patterns 427a and 427b and the filling patterns 429a and 429b, respectively, may be formed to have substantially almost the same size or similar sizes between which a difference is less than 10%.

From FIGS. 3A and 3B and the descriptions thereof, the following can be sufficiently understood. When the spacer patterns or sidewall patterns are formed on the inner walls of the lower contact holes, a spacer pattern or sidewall pattern having a relatively large horizontal width may be formed on the inner wall of a lower contact hole having a relatively large hole size, and a spacer pattern or sidewall pattern having a relatively small horizontal width may be formed on the inner wall of a lower contact hole having a relatively small hole size. As a result, the actual hole sizes of the contact plugs can be equalized to each other. Further, it can be expected that the technical idea of the inventive concept can be applied to a variety of fields in various forms.

Figure 4A:
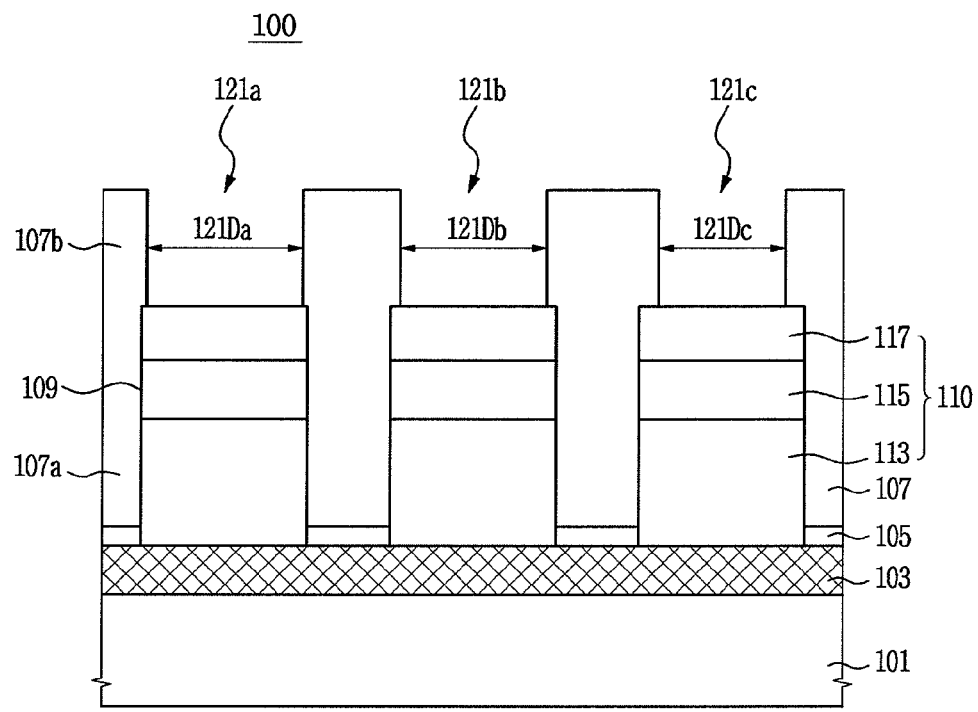
FIGS. 4A to 4E are vertical cross-sectional views illustrating a method of manufacturing a semiconductor device according to an exemplary embodiment of the inventive concept.

FIGS. 4A to 4E are vertical cross-sectional views illustrating a method of manufacturing a semiconductor device according to an exemplary embodiment of the inventive concept. Referring to FIG. 4A, the method of forming a semiconductor device 100 according to an exemplary embodiment of the inventive concept includes forming a lower interconnection 103 on a substrate 101, forming a capping layer 105 on the lower interconnection 103, forming a first interlayer insulating layer 107 on the capping layer 105, forming control pattern holes 109 vertically passing through the first interlayer insulating layer 107, and forming control patterns 110 filling the control pattern holes 109. In this method, after the control patterns 110 are formed, lower contact holes 121a to 121c may be formed to vertically pass through the first interlayer insulating layer 107 and to partially expose upper surfaces of the control patterns 110. That is, the control pattern holes 109 and the lower contact holes 121a to 121c may be formed by one process simultaneously, or components designated by the two terms may be substantially the same components. Alternatively, the control pattern holes 109 and the lower contact holes 121a to 121c may be individually formed through separate processes. In this case, after a first lower interlayer insulating layer 107a and the control pattern holes 109 are formed, the control patterns 110 may be formed. Subsequently, a first upper interlayer insulating layer 107b may be formed, and the lower contact holes 121a to 121c may be then formed.

The lower interconnection 103 may be formed by implanting ions into the substrate 101. A buffer layer may be formed on the entire surface of the substrate 101, and an ion implantation mask pattern may be formed on the buffer layer. Then, n-type or p-type ions may be implanted to form the lower interconnection 103. After the ions are implanted at a proper concentration, the ion implantation mask pattern and the buffer layer may be removed. The buffer layer may be formed of silicon oxide, and the ion implantation mask pattern may be formed of a photoresist pattern or a denser material than silicon oxide. For example, the ion implantation mask pattern may be formed of silicon nitride or silicon oxynitride. Alternatively, after a trench to form the lower interconnection 103 therein is formed, the trench may be filled with a conductor to form the lower interconnection 103. Alternatively, conductive patterns may be formed on the substrate 101. For example, after a conductive material layer is formed on the substrate 101, the lower interconnections 103 may be formed using a photolithography process.

When the capping layer 105 is formed of a conductor, it may be formed only on the lower interconnection 103. In this case, the process of forming the capping layer 105 is successively performed after the process of forming the lower interconnections 103. When the capping layer 105 is formed of an insulating layer, it may be formed on the entire surfaces of the lower interconnection 103 and the substrate 101.

The first interlayer insulating layer 107 may be formed of, for example, silicon oxide having beneficial planarization ability. The first interlayer insulating layer 107 may not be formed by one process, but by two successive processes. For example, a process using plasma and a process using thermal energy may be properly mixed, and liquid silicon oxide having beneficial fluidity may be used to form the first interlayer insulating layer 107 through a coating method. Alternatively, a process for increasing evenness through an ion sputter or etching process may be inserted intermediately. In addition, a variety of processes for forming silicon may be properly mixed or repeated to form the first interlayer insulating layer 107. That is, the first interlayer insulating layer 107 may be composed of, for example, multilayer insulating layers 107a and 107b between which the interface is not shown.

The control patterns 110 may be formed by the following process. First, material patterns for forming n-type ion doping patterns are formed, and n-type ions may be implanted. The material patterns for forming the n-type ion doping patterns 113 may be formed by, for example, an epitaxial growth method. P-type ion doping patterns 115 may be also formed by, for example, an epitaxial growth method. After that, p-type ions may be implanted to form the p-type ion doping patterns 115. In a case of an ion doping structure, e.g., a pnpn thyristor, in which the control patterns 110 are repeated, the ion implantation process may be repeated. In this case, however, the epitaxial growth process need not be repeated. One epitaxial growth process and multiple ion implantation processes may be performed. When the control patterns 110 are formed of only one kind of conductor, only one kind of ion polarity may be applied. At this time, the control patterns 110 are plug patterns, and may be formed in an integration type or a multilayer type. When the control patterns 110 are formed in a multilayer type, this means that multiple epitaxial growth processes and ion implantation processes may be repeated. For example, the control patterns 110 may be formed up to a proper height through the epitaxial growth process, and processes and structures for forming ohmic contacts and so on may be then applied. For example, a metal silicide layer may be formed, and a metal compound layer including TiN may be formed. Further, it may be understood that pad patterns and plug patterns are formed or overlapped. The control patterns 110 may include barrier patterns 117. The barrier patterns 117 may be formed, for example, in a single-layer or multilayer structure of a metal, a metal alloy, or a metal compound.

The lower contact holes 121a to 121c may be formed by, for example, a photolithography process. It is assumed that at least two lower contact holes 121a to 121c having different hole sizes are included. This does not mean that the lower contact holes 121a to 121c are formed to have different hole sizes on purpose, but illustrates a case in which the lower contact holes 121a to 121c having different holes sizes are formed during the process of forming lower contact holes 121x. FIG. 4A illustrates three lower contact holes 121a to 121c having different hole sizes such that the technical idea of the inventive concept can be readily understood. In the drawing, the first lower contact hole 121a has the largest hole size, the second lower contact hole 121b has an intermediate hole size, and the third lower contact hole 121c has the smallest hole size.

Figure 4B:
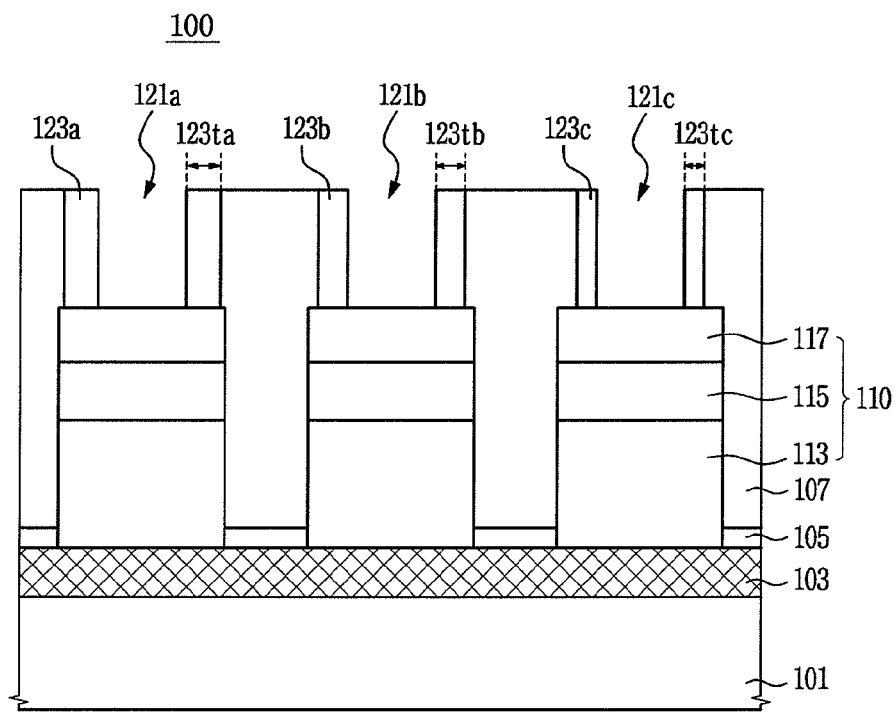

Referring to FIG. 4B, the method of manufacturing a semiconductor device 100 according to an exemplary embodiment of the inventive concept includes forming sidewall patterns 123a to 123c on sidewalls of the lower contact holes 121a to 121c. The respective sidewall patterns 123a to 123c may be formed by the following process. First, an insulating material is relatively conformably formed on bottoms and sidewalls of the lower contact holes 121a to 121c and the first interlayer insulating layer 107. Then, a blanket-etch or chemical mechanical polishing (CMP) process is performed to form the sidewall patterns 123a to 123c. The CMP process may be performed, after the lower contact holes 121a to 121c are filled with organic or inorganic materials. Then, a process of removing the organic or inorganic materials filling the lower contact holes 121a to 121c may be performed. The first sidewall pattern 123a formed on the sidewall of the first lower contact hole 121a may have the largest horizontal width 123ta. The second sidewall pattern 123b formed on the sidewall of the second lower contact hole 121b may have an intermediate horizontal width 123tb. The third sidewall pattern 123c formed on the sidewall of the third lower contact hole 121c may have the smallest horizontal width 123tc. In this exemplary embodiment of the inventive concept, the sidewall patterns 123a to 123c may be formed of, for example, a silicon nitride layer. When the sidewall patterns 123a to 123c are formed of a silicon nitride layer, a lower contact hole having a relatively larger hole size has a thicker sidewall pattern, and a lower contact hole having a relatively smaller hole size has a thinner sidewall pattern. The method of foaming such sidewall patterns 123a to 123c may endow a specific direction to a process condition in a process of depositing insulating materials to form the sidewall patterns 123a to 123c. For example, the direction of the process condition is to keep the temperature of the deposition process as low as possible, to keep the pressure of the deposition process as high as possible, to keep the concentration of a reactant radical included in a reaction gas as low as possible, or to activate the reaction gas using radio frequency (RF) plasma energy. In this description, "higher" and "lower" are not absolute criteria, but means relative criteria. In other words, they mean that something is "higher" or "lower" within the process condition at which insulating materials can be deposited. A more reasonable process condition can be understood from descriptions of other exemplary embodiments of the inventive concept of this specification.

Figure 4C:
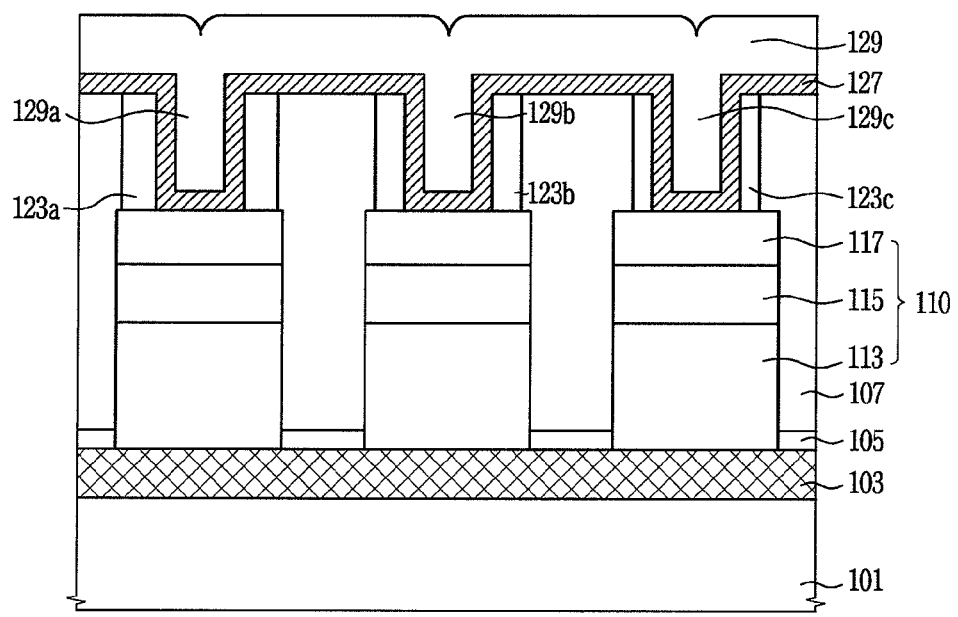

Referring to FIG. 4C, the method of manufacturing a semiconductor device 100 according to an exemplary embodiment of the inventive concept includes conformably forming an electrode material layer 127 on the bottoms of the lower contact holes 121a to 121c, the sidewalls of the spacer patterns 123a to 123c, and the surface of the first interlayer insulating layer 107 inside the lower contact holes 121a to 121c and filling the remaining portions of the lower contact holes 121a to 121c with a filling material layer 129 such that the filling material layer 129 formed on the electrode material layer 127 becomes relatively thick. For example, in this exemplary embodiment of the inventive concept, the electrode material layer 127 may be a metal layer, and the filling material layer 129 may be an insulating layer. For example, the filling material layer 129 may be silicon oxide or silicon nitride. However, various materials can be applied as the electrode material layer 127 and the filling material layer 129.

For example, the electrode material layer 127 may be a metal layer formed of tungsten or copper or one of various barrier metal layers including titanium(Ti)/titanium nitride (TiN) or tantalum nitride (TaN), tantalum oxide (TaO) and so on. That is, the electrode material layer 127 may be a diffusion barrier layer. Further, the filling material layer 129 may be formed of a conductive metal. That is, the filling material may be formed of, for example, a metal plug.

Figure 4D:
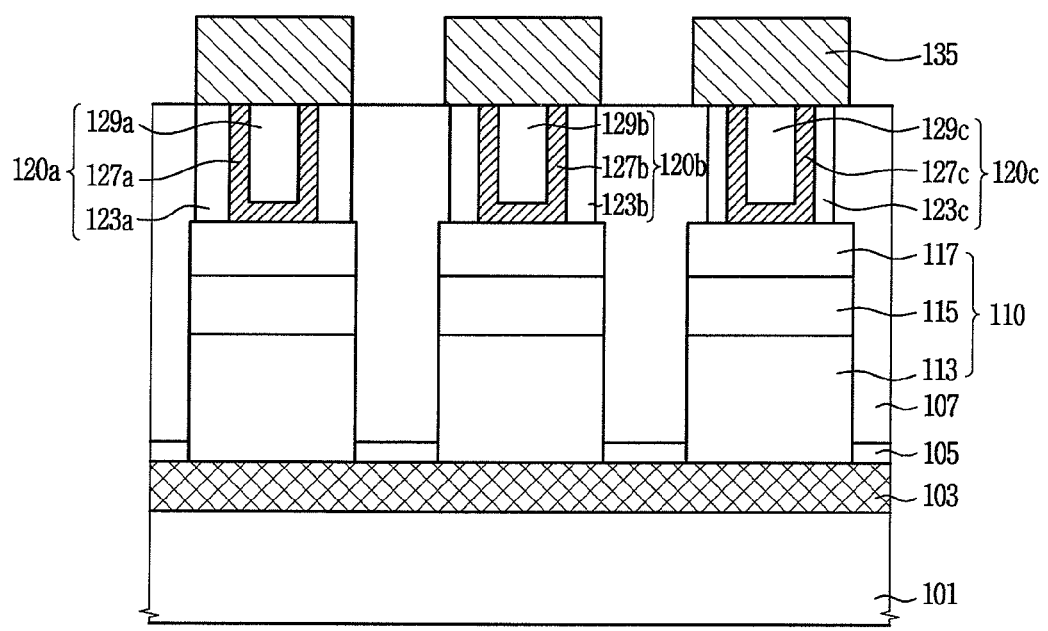

Referring to FIG. 4D, the method of manufacturing a semiconductor device 100 according to an exemplary embodiment of the inventive concept includes planarizing the surfaces of the first interlayer insulating layer 107, the sidewall patterns 123a to 123c, the electrode patterns 127a to 127c, and the filling material patterns 129a to 129c using, for example, a planarization process such as CMP, and forming storage patterns 135. As for the storage patterns 135, various patterns may be used depending on the types of semiconductors. For example, the storage patterns 135 may be composed of capacitor patterns in a case of DRAM, may be floating conductor patterns in a case of a non-volatile memory device, may be charge trap patterns such as oxide nitride oxide (ONO) in a case of a charge trap memory device, or may be resistance change material patterns, magnet change material patterns, or phase change material patterns in a case of a resistance memory device. In this exemplary embodiment of the inventive concept, it is assumed that the storage patterns 135 are phase changeable material patterns.

Figure 4E:
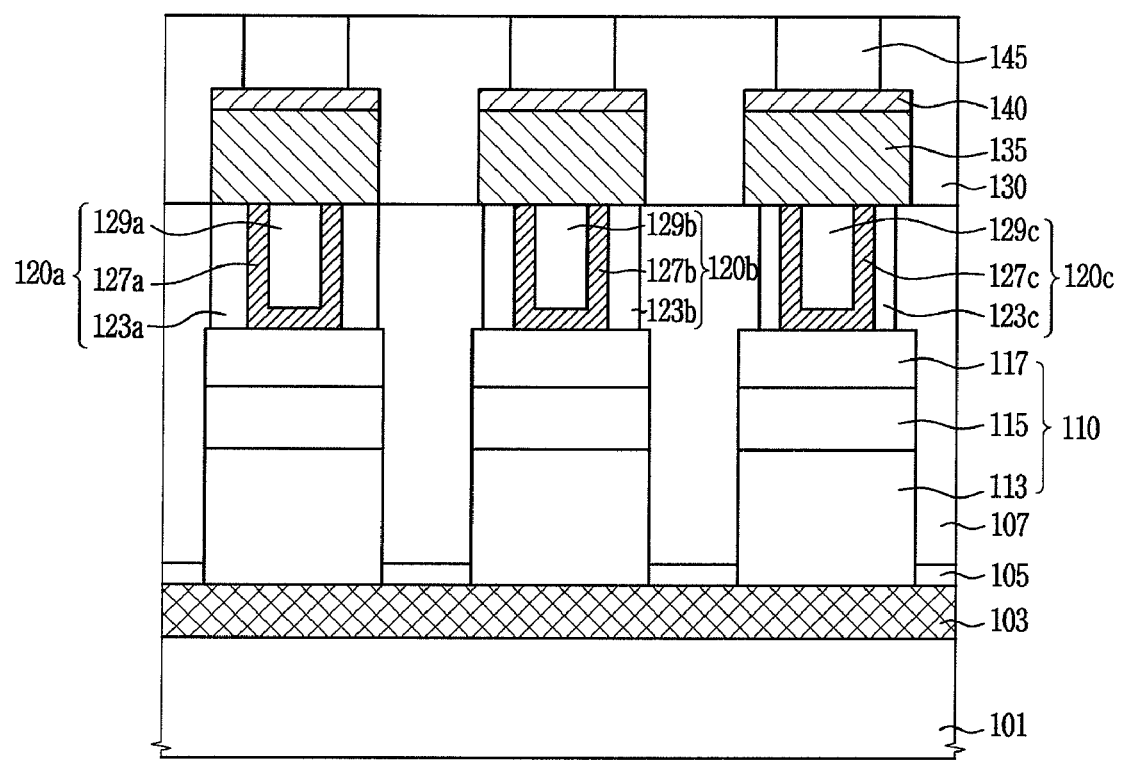

Referring to FIG. 4E, the method of manufacturing a semiconductor device 100 includes forming upper electrodes 140 on the storage patterns 135, forming a second interlayer insulating layer 130, and forming upper contact plugs 145. The upper electrodes 140 may be interpreted as barrier layers in another application exemplary embodiment of the inventive concept. The upper electrodes 140 may be formed in, for example, a single-layer or multilayer structure of a metal, a metal alloy, or a metal compound. For example, the upper electrodes 140 may be formed of tungsten (W), Ti/TiN, TaO, TaN or the like. Although other metals are not excluded, phase changeable materials, resistance changeable materials, and magnet changeable materials may be excluded. The upper contact plugs 145 may be formed of a conductor, for example, a metal. The upper interconnections 150 may be formed of, for example, a metal or the like in a line shape. The second interlayer insulating layer 130 and a third interlayer insulating layer 155 may be formed of, for example, silicon oxide like the first interlayer insulating layer 107. The first, second, and third interlayer insulating layers 107, 130, and 155 may include other materials in addition to silicon and oxygen. The other materials may be materials for improving fluidity of pure silicon oxide or materials for adjusting permittivity of silicon oxide. For example, hydrogen (H), boron (B), carbon (C), fluorine (F), phosphorous (P) and so on may be added. Further, the second interlayer insulating layer 130 may be formed in a multilayer structure. The forming of the second interlayer insulating layer 130 may be performed several times in several steps. For example, the forming may be performed before and after the storage patterns 135 are formed, before and after the upper electrode patterns 140 are formed, and before and after the upper contact plugs 145 are formed. In some steps, the forming may not be performed. That is, the forming may be omitted in a specific step. After that, the upper interconnections 150 are formed, and the third interlayer insulating layer 155 is then formed. That is, the structure of the semiconductor device shown in FIG. 1A may be formed. Referring to FIG. 1A, the third interlayer insulating layer 155 may also be formed independently before and after the upper interconnections 150 are formed. Some of these application exemplary embodiments of the inventive concept will be omitted to prevent the drawings from becoming complicated and the descriptions from becoming duplicated and ambiguous. However, one of ordinary skill in the art will be able to readily understand from various descriptions of this specification that various application processes can be applied.

Figure 5A:
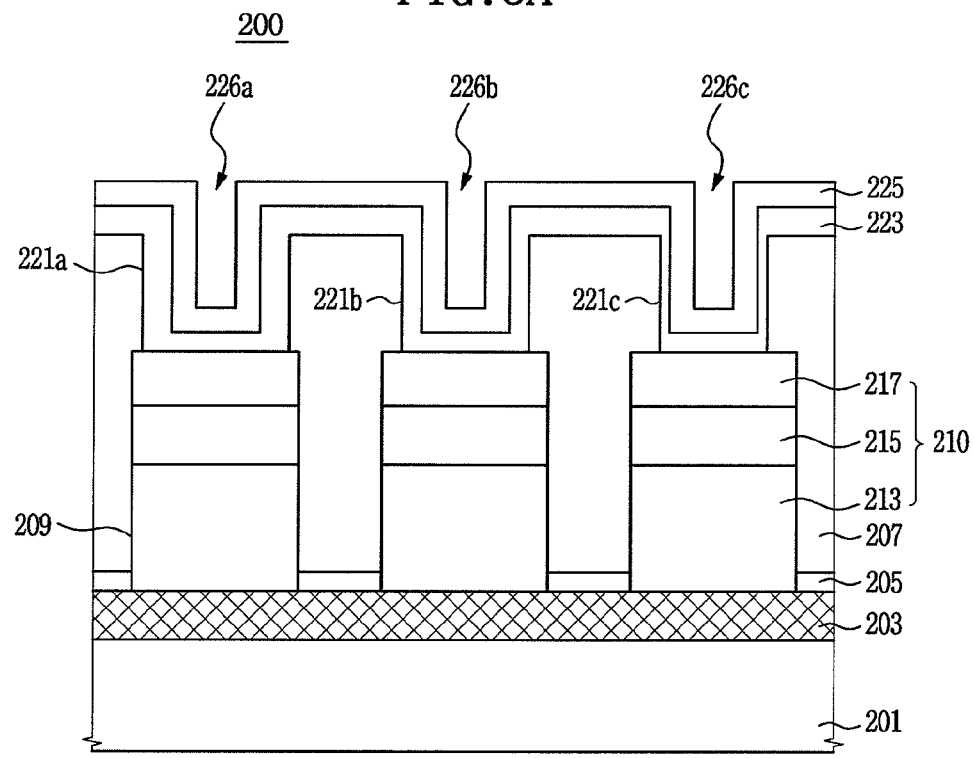
FIGS. 5A and 5E are vertical cross-sectional views illustrating a method of manufacturing a semiconductor device according to an exemplary embodiment of the inventive concept.
Figure 5B:
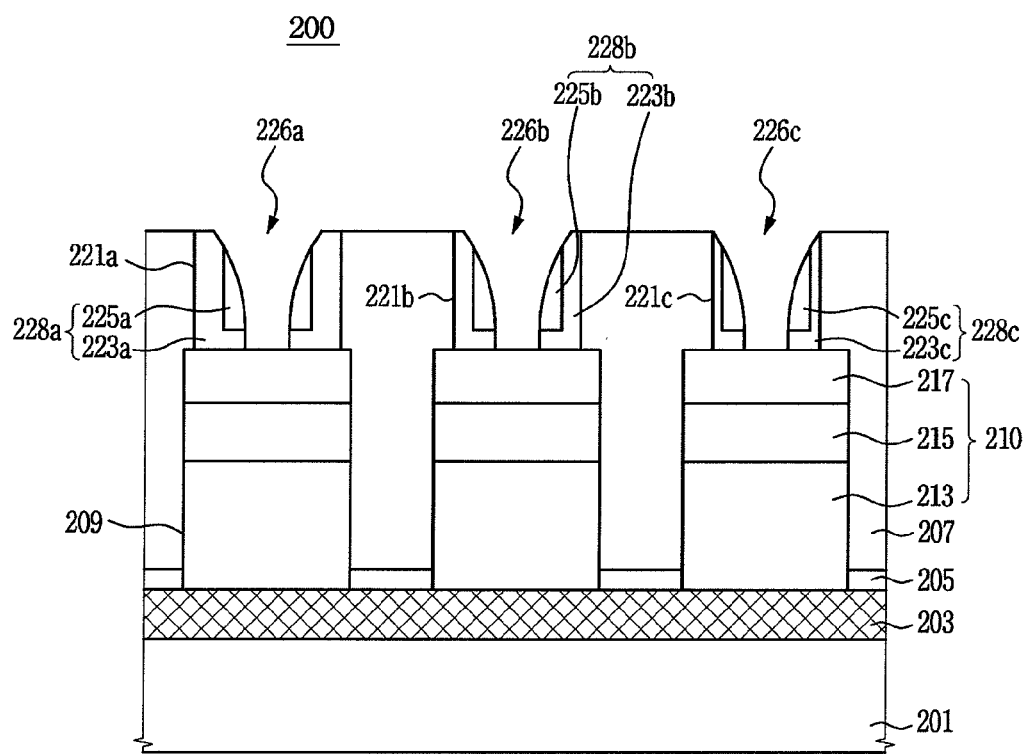

FIGS. 5A and 5B are vertical cross-sectional views illustrating a method of manufacturing a semiconductor device according to another exemplary embodiment of the inventive concept. Referring to FIG. 5A, the method of manufacturing a semiconductor device 200 according to the present exemplary embodiment of the inventive concept includes forming a lower interconnection 203 on a substrate 201, forming a capping layer 205 on the lower interconnection 203, forming a first interlayer insulating layer 207 on the capping layer 205, forming control pattern holes 209 vertically passing through the first interlayer insulating layer 207, and forming control patterns 210 filling the control pattern holes 209. Further, the method further includes forming multilayer insulating layers 223 and 225 for forming sidewall patterns on the exposed control patterns 210, sidewalls of the control pattern holes 209 which are not filled, and the first interlayer insulating layer 207. In this process, after the control patterns 210 are formed, lower contact holes 221a to 221c may be formed to vertically pass through the first interlayer insulating layer 207 and to partially expose the upper surfaces of the control patterns 210. That is, the control pattern holes 209 and the lower contact holes 221a to 221c may be formed simultaneously through one process, or components designated by the two terms may be substantially the same components.

Alternatively, the method may further include forming lower contact holes 221a to 221c which vertically pass through the first interlayer insulating layer 207 and partially expose the upper surfaces of the control patterns 210. In this case, the method includes forming multilayer insulating layers 223 and 225 for forming sidewall patterns on the bottoms and sidewalls of the lower contact holes 221a to 221c and the first interlayer insulating layer 207. In this exemplary embodiment of the inventive concept, the multilayer insulating layers 223 and 225 are each composed of two layers. For convenience, the multilayer insulating layers 223 and 225 are called an outer insulating layer 223 and an inner insulating layer 225, respectively.

The outer insulating layer 223 and the inner insulating layer 225 may be formed under different process conditions. For example, the deposition process temperature of a process for forming the outer insulating layer 223 is lower than that of a process for forming the inner insulating layer 225, the deposition process pressure of the process for forming the outer insulating layer 223 is higher than that of the process for forming the inner insulating layer 225, the concentration of a reactant radical included in reaction gases in the process for forming the outer insulating layer 223 is lower than that of the process for forming the inner insulating layer 225, or reaction gases are activated by RF plasma energy in the process for forming the outer insulating layer 223. The process for forming the outer insulating layer 223 includes at least one or more of the above-described process conditions. When the outer insulating layer 223 is formed under the process conditions oriented in such a manner, the outer insulating layer 223 formed on an inner wall of the lower contact hole 221a having a relatively large hole size may have a larger thickness than the inner insulating layer 225 formed on an inner wall of the lower contact hole 221c having a relatively small hole size. On the other hand, the process for forming the inner insulating layer 225 includes one or more of the following conditions: the deposition process temperature of the process for forming the inner insulating layer 225 is higher than that of the process for forming the outer insulating layer 223, the deposition process pressure of the process for forming the inner insulating layer 225 is lower than that of the process for forming the outer insulating layer 223, the concentration of reaction radical in the process for forming the inner insulating layer 225 is higher than that of the process for forming the outer insulating layer 223, and reaction gases are activated by thermal energy. When the inner insulating layer 225 is formed under the process conditions, the inner insulating layer 225 may have a conformal profile as a whole regardless of the sizes of the lower contact holes 221a to 221c. Although the drawings illustrate that there is an interface between the outer insulating layer 223 and the inner insulating layer 225, the interface is drawn merely to describe a difference between the formation processes. Therefore, the interface may not actually be shown. Further, the process for forming the outer insulating layer 223 and the process for forming the inner insulating layer 225 may be consecutively performed in the same reaction chamber. In this case, the conditions of both of the formation processes can be changed step by step. Even in this case, the interface between the outer insulating layer 223 and the inner insulating layer 225 may not actually be shown. Even when the insulating layers 223 and 225 are composed of three or more layers, the interfaces therebetween may not be shown.

Referring to FIG. 5B, the method of manufacturing a semiconductor device 200 according to another exemplary embodiment of the inventive concept includes forming sidewall patterns 228a to 228c including multilayer spacer patterns 223a, 225a, 223b, 225b, 223c, and 225c through, for example, a blanket-etch process and so on. For example, the respective sidewall patterns 228a to 228c may include outer spacer patterns 223a to 223c and inner spacer patterns 225a to 225c. The blanket-etch process may be a process for forming the multilayer spacer patterns 223a, 225a, 223b, 225b, 223c, and 225c. As a result of the process, the lower contact holes 221a to 221c may have the same or similar size. In other words, size deviations between the lower contact holes 221a to 221c may fall within a permissible value. At this time, the bottom surfaces of the lower contact holes 221a to 221c, that is, the upper surfaces of the control patterns 210 may be partially exposed.

Figure 5C:
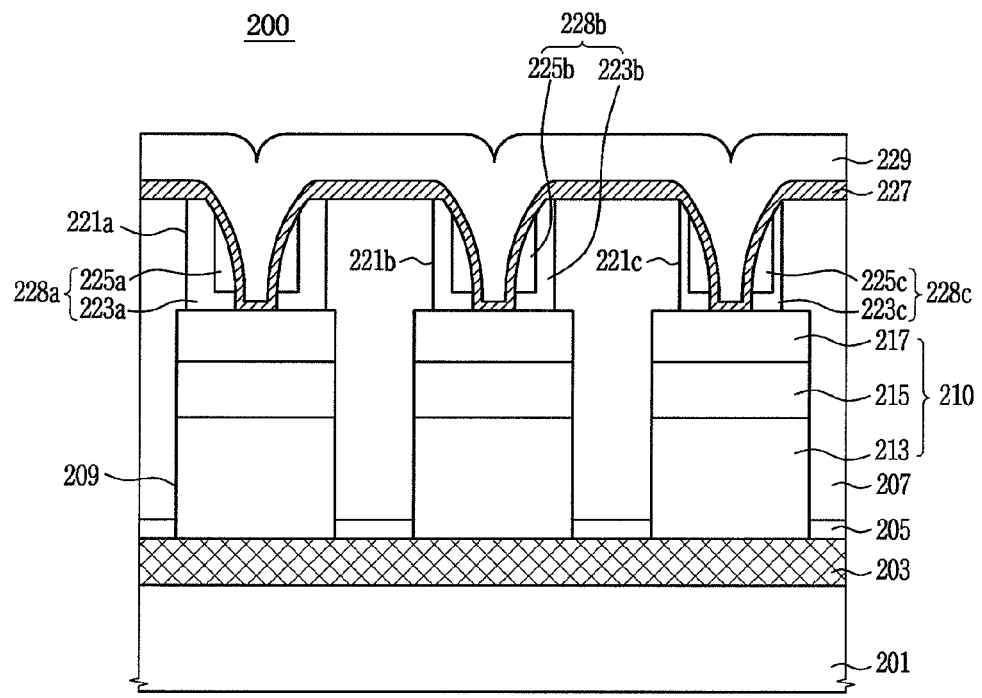

Referring to FIG. 5C, the method of manufacturing a semiconductor device 200 according to another exemplary embodiment of the inventive concept includes conformably forming an electrode material layer 227 in the lower contact holes 221a to 221c and forming a filling material layer 229 filling the inside of the lower contact holes 221a to 221c. The electrode material layer 227 may be formed on bottom surfaces of the exposed lower contact holes 221a to 221c, the sidewall patterns 228a to 228c, and the first interlayer insulating layer 207. The filling material layer 229 may be formed on the electrode material layer 227.

Figure 5D:
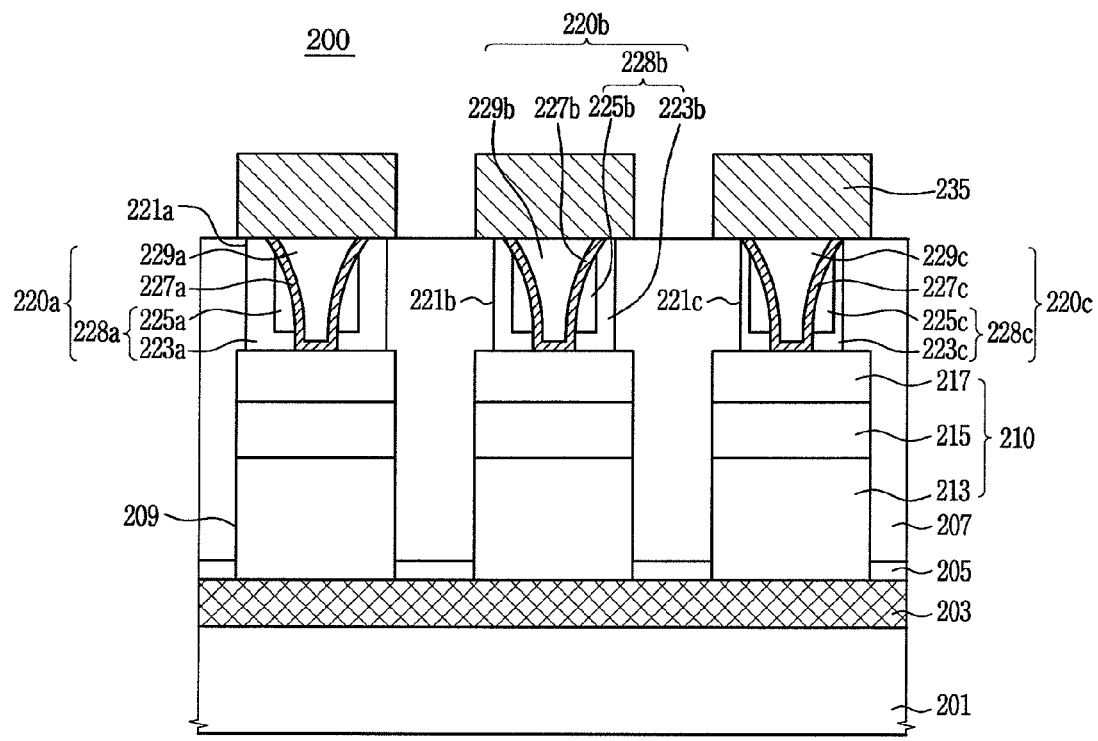

Referring to FIG. 5D, the method of manufacturing a semiconductor device 200 according to another exemplary embodiment of the inventive concept includes planarizing the filling material layer 229 and the electrode material layer 227 to form lower contact plug patterns 220a to 220c, and forming storage patterns 235.

Figure 5E:
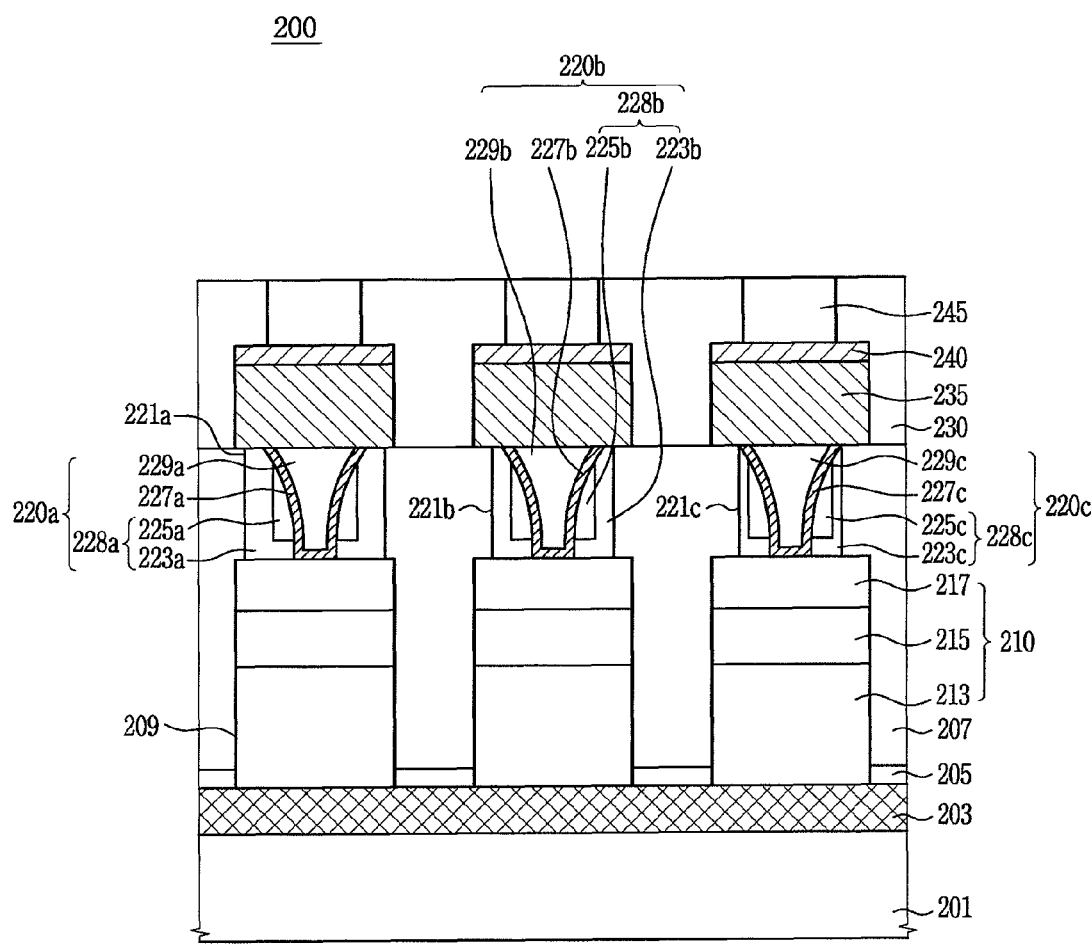

Referring to FIG. 5E, the method of manufacturing a semiconductor device 200 according to another exemplary embodiment of the inventive concept includes forming upper electrodes 240 on the storage patterns 235, forming a second interlayer insulating layer 230, and forming upper contact plugs 245. Further, referring to FIG. 2A, the method includes forming upper interconnections 250 and forming a third interlayer insulating layer 255. The upper electrodes 240 may be understood as barrier layers in another application exemplary embodiment of the inventive concept.

The descriptions of the method of manufacturing a semiconductor device 200 illustrated in FIGS. 5A to 5E may be understood by referring to the descriptions of the method of manufacturing the semiconductor device 100 illustrated in FIGS. 4A to 4E. That is, components which have not been described in FIGS. 5A to 5E or contents which have been simply described in the drawings can be understood from the descriptions made by referring to FIGS. 4A to 4E.

In this specification, the reason that the process conditions have not been described as numerical values is that, as described above, the numerical values are set differently depending on the sizes and depths of the lower contact holes, intervals between the lower contact holes, materials to be formed, equipments used in the process, elements contained in reaction gases, the thickness and relative thickness of an insulating layer to be formed, and other various variables. In other words, absolute values are not provided, but only a relative orientation of process condition setting is provided.

Figure 6:
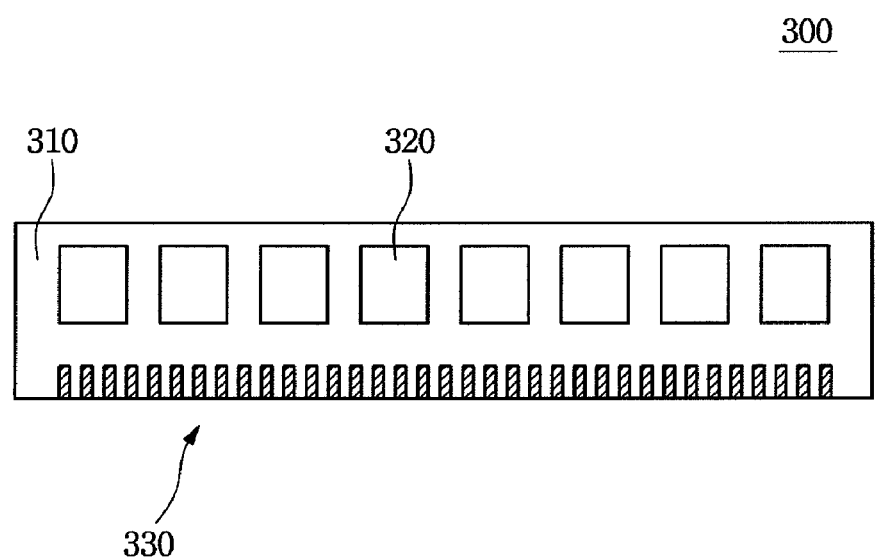
FIG. 6 illustrates a semiconductor module according to an embodiment of the inventive concept.

FIG. 6 illustrates a semiconductor module according to an embodiment of the present general inventive concept. Referring to FIG. 6, a semiconductor module 300 according to an embodiment of the present general inventive concept includes a module substrate 310, a plurality of semiconductor packages 320 disposed on the module substrate 310, and a plurality of contact terminals 330 formed at the edge of the module substrate 310 and connected to the plurality of semiconductor packages 320, respectively.

The module substrate 310 may be, for example, a printed circuit board. Both sides of the module substrate 310 may be used. In other words, the semiconductor devices may be disposed on both sides of the module substrate 310. One of the semiconductor packages 320 may be a control device to control the other semiconductor packages 320. Or, another semiconductor package to control the plurality of semiconductor packages 320 may be further disposed.

At least one of the semiconductor packages 320 may include at least one of the semiconductor devices according to exemplary embodiments of the inventive concept.

The contact terminals 330 may be formed of metals. The contact terminals 330 may be variously formed and/or disposed on the module substrate. Thus, the number of the contact terminals 330 does not have any particular limit.

Figure 7:
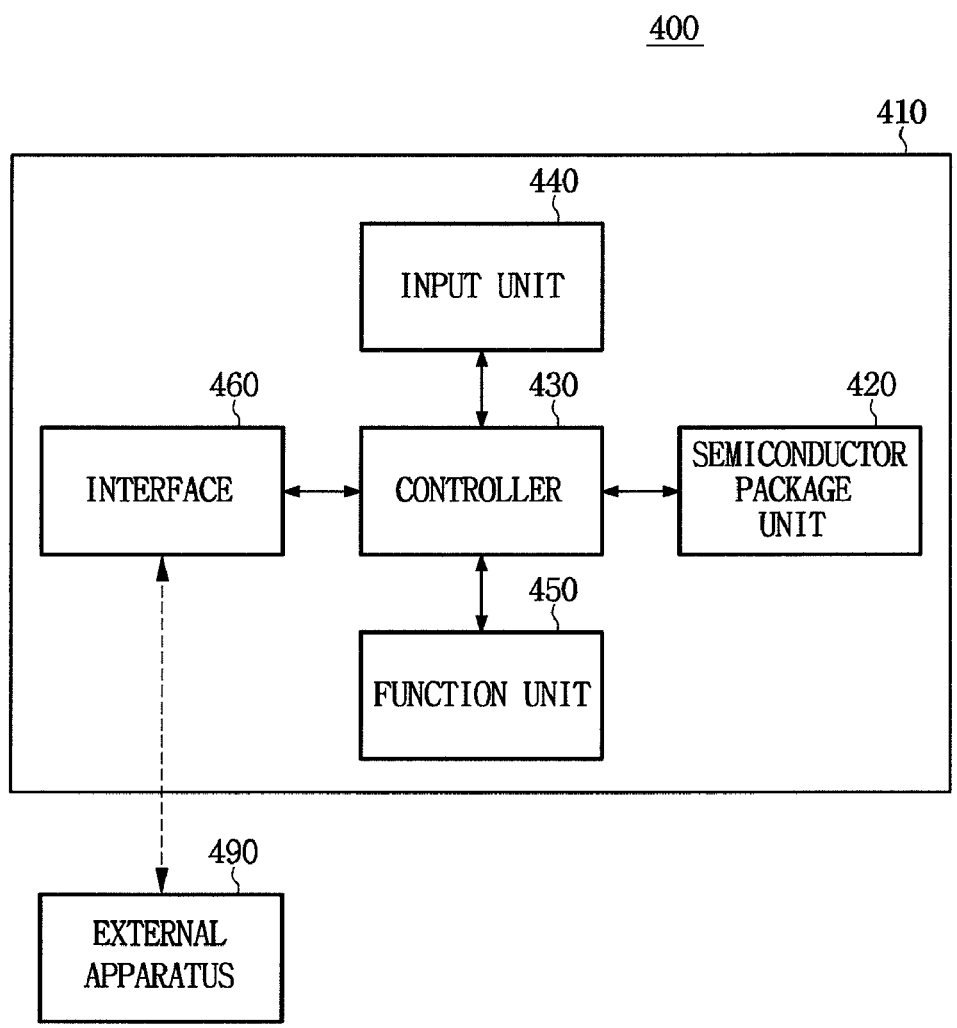
FIG. 7 is a block diagram illustrating an electronic apparatus according to an exemplary embodiment of the inventive concept.

FIG. 7 is a block diagram illustrating an electronic apparatus 400 according to an embodiment of the present general inventive concept. The electronic apparatus 400 may include a housing 410 to accommodate elements or units of the electronic apparatus 400, a memory unit 420, a controller 430, an input/output unit 440, a function unit 450, and/or an interface unit 460 to communicate with an external apparatus 490 through a wired or wireless communication line to receive and transmit data or signal. At least one of the semiconductor devices 100, 200 and semiconductor module 300 illustrated in FIGS. 1A through 6 can be used as the memory unit 420. Therefore, the memory unit 420 can be referred to as the semiconductor devices 100, 200 or the semiconductor module 300. The data may be input through the input/output unit 440, the function unit 450, and/or the external apparatus 490 through the interface unit 460.

The function unit 450 may be a unit to perform a function or operation of the electronic apparatus 400. For example, when the electronic apparatus 400 is an image processing apparatus, a television apparatus, or a monitor apparatus, the function unit 450 may be a display unit to display an image and/or an audio output unit to generate a signal or sound according to the data. When the electronic apparatus is a mobile phone, the function unit 450 may be a mobile phone function unit to perform a mobile phone function, for example, dialing, text messaging, photographing using a camera unit formed on the housing 410, audio and video data processing to be displayed on a display unit formed on the housing 410, etc. When the electronic apparatus is an image forming or scanning apparatus, the function unit 450 may be an image forming unit to feed a printing medium, to form or print an image on the printing medium, or to scan a document or picture to be stored in the memory unit. When the electronic apparatus 400 is a camera or camcorder, the function unit 1350 may be a unit to photograph an image as a movie or a still image.

The controller 430 controls elements and units of the electronic apparatus 400 or may be a processor. At least one of the semiconductor devices 100, 200 and the semiconductor module 300 illustrated in FIGS. 1A through 6 can be included in the controller 430. Therefore, the controller 430 can be referred to as the semiconductor devices 100, 200 or the semiconductor module 300.

Additionally, the names and functions of components which do not have reference numerals in the drawings can be readily understood from other drawings of this specification and the descriptions thereof.

As described above, a semiconductor device according to exemplary embodiments of the inventive concept of the inventive concept includes contact plugs having uniform size, and thus the current deviation is small and the operation of the device is stable.

The foregoing is illustrative of exemplary embodiments of the inventive concept and is not to be construed as limiting thereof.

Having described the exemplary embodiments of the inventive concept, it is further noted that it is readily apparent to those of reasonable skill in the art that various modifications may be made without departing from the spirit and scope of the invention which is defined by the metes and bounds of the appended claims.

What is claimed is:

1. A semiconductor device comprising:
  a lower interconnection formed on a substrate;
  a plurality of control patterns formed on the lower interconnection;
  a plurality of lower contact plug patterns formed on the control patterns;
  a plurality of storage patterns formed on the lower contact plug patterns;
  a plurality of upper electrodes formed on the storage patterns; and
  a plurality of upper interconnections formed on the upper electrodes,
  wherein the lower contact plug patterns include:
  at least two contact holes having different sizes,
  a plurality of sidewall patterns formed on inner sidewalls of the two contact holes and wherein the sidewall patterns have different thicknesses from one another,
  a plurality of electrode patterns conformably formed inside of the sidewall patterns and having size errors less than 10%, and
  a plurality of filling patterns formed inside the electrode patterns and completely filling the inside of the contact holes.

2. The semiconductor device according to claim 1, wherein the control patterns are diodes or transistors.

3. The semiconductor device according to claim 1, wherein the storage patterns are made of a resistance change material pattern.

4. The semiconductor device according to claim 1, wherein the size of the lower contact holes is a horizontal diameter of the lower contact holes; and among the sidewall patterns having different thicknesses, a sidewall pattern having a relatively larger thickness is formed in a lower contact hole having a relatively larger size, and a sidewall pattern having a relatively smaller thickness is formed in a lower contact hole having a relatively smaller size.

5. The semiconductor device according to claim 4, wherein the sidewall patterns include outer spacer patterns and inner spacer patterns, and the outer spacer pattern formed in the lower contact hole having a relatively larger size has a larger width than the outer space pattern formed in the lower contact hole having a relatively smaller size.

6. The semiconductor device according to claim 5, wherein the sidewall patterns have a triple structure including intermediate spacer patterns, and
a thickness difference ratio of the intermediate spacer patterns is smaller than that of the outer spacer patterns and larger than that of the inner spacer patterns.

7. The semiconductor device according to claim 5, wherein the sidewall patterns have a multilayer structure including multilayer spacer patterns,
wherein in the multilayer spacer patterns, a thickness difference ratio of the outermost spacer patterns is the largest, a thickness difference ratio of the innermost spacer patterns is the smallest, and a thickness difference ratio of intermediate spacer patterns formed between the outermost spacer patterns and the innermost spacer patterns gradually decreases toward the innermost side from the outermost side.

8. A semiconductor module comprising:
a module substrate;
at least one semiconductor device disposed on the module substrate; and
a contact terminal disposed at an edge of the module substrate,
wherein the at least one semiconductor device is the semiconductor device according to claim 1.

9. An electronic apparatus comprising,
a housing;
a memory unit in the housing;
an input/output unit; and
a controller to control the memory unit and the input/output unit,
wherein the memory unit includes the semiconductor device of claim 1.

10. A semiconductor device comprising:
a lower interconnection formed on a substrate;
a capping layer formed on the lower interconnection;
a first interlayer insulating layer formed on the capping layer;
a plurality of control patterns composed of diodes formed in the first interlayer insulating layer and on the lower interconnection, and wherein the control patterns each include a first conductivity type ion doping pattern, a second conductivity type ion doping pattern and a barrier pattern;
a plurality of lower contact plug patterns formed in the first interlayer insulating layer and on the control patterns;
a second interlayer insulating layer formed on the first interlayer insulating layer;
a plurality of storage patterns made of resistance changeable materials formed in the second interlayer insulating layer and on the lower contact plug patterns;
a plurality of upper electrodes formed in the second interlayer insulating layer and on the storage patterns;
a plurality of upper contact plugs formed in the second interlayer insulating layer and on the upper electrodes;
a third interlayer insulating layer formed on the second interlayer insulating layer; and
a plurality of upper interconnections formed in the third interlayer insulating layer and on the upper contact plugs, wherein the upper electrodes are electrically connected to the upper interconnections via the upper contact plugs,
wherein the lower contact plug patterns include:
a first contact hole having a first diameter, a second contact hole having a second diameter being smaller than the first diameter, and a third contact hole having a third diameter being smaller than the second diameter, wherein difference ratio of the first and third diameters is less than 10%,
a first spacer formed on an inner sidewall of the first contact hole, a second spacer formed on an inner sidewall of the second contact hole, and a third spacer formed on an inner sidewall of the third contact hole, wherein the first spacer has a first thickness, the second spacer has a second thickness thinner than the first thickness, and the third spacer has a third thickness thinner than the second thickness, wherein the difference ratio of the first and third thicknesses is less than 10%,
a first electrode pattern conformably formed on an inner sidewall of the first spacer, a second electrode pattern conformably formed on an inner sidewall of the second spacer, and a third electrode pattern conformably formed on an inner sidewall of the third spacer, wherein the difference ratio of the first and third electrode patterns is less than 10%, and
a plurality of filling patterns formed inside the electrode patterns and completely filling the inside of the contact holes.

* * * * *